(12) United States Patent
Yang et al.

(10) Patent No.: US 12,068,245 B2
(45) Date of Patent: *Aug. 20, 2024

(54) MEMORY DEVICE, SEMICONDUCTOR DEVICE, AND MANUFACTURING METHOD THEREOF

(71) Applicant: Taiwan Semiconductor Manufacturing Company, Ltd., Hsinchu (TW)

(72) Inventors: TsuChing Yang, Taipei (TW); Hung-Chang Sun, Kaohsiung (TW); Sheng-Chih Lai, Hsinchu County (TW); Yu-Wei Jiang, Hsinchu (TW); Kuo-Chang Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/086,569

(22) Filed: Dec. 21, 2022

(65) Prior Publication Data

US 2023/0120530 A1 Apr. 20, 2023

Related U.S. Application Data

(63) Continuation of application No. 17/185,984, filed on Feb. 26, 2021, now Pat. No. 11,569,165.

(Continued)

(51) Int. Cl.
| | | |
|---|---|---|
| *H01L 23/522* | (2006.01) | |
| *H01L 21/768* | (2006.01) | |
| *H01L 23/528* | (2006.01) | |
| *H10B 51/20* | (2023.01) | |
| *H10B 51/30* | (2023.01) | |
| *H10B 51/40* | (2023.01) | |

(52) U.S. Cl.
CPC .... H01L 23/5226 (2013.01); H01L 21/76816 (2013.01); H01L 21/76877 (2013.01); H01L 23/5283 (2013.01); H10B 51/20 (2023.02); H10B 51/30 (2023.02); H10B 51/40 (2023.02)

(58) Field of Classification Search
CPC .......... H01L 23/5226; H01L 21/76816; H01L 21/76877; H01L 23/5283; H01L 27/1159; H01L 27/11592; H01L 27/11597; H01L 27/11565; H01L 27/11575; H01L 27/11587; H01L 27/11595; H01L 27/11578; H01L 27/11568; H01L 27/11582

See application file for complete search history.

(56) References Cited

U.S. PATENT DOCUMENTS 10,878,908 B2 * 12/2020 Jeong .................... H10B 43/27
2017/0207238 A1 * 7/2017 Lee ...................... H01L 23/5226

* cited by examiner

Primary Examiner — Karen Kusumakar
(74) Attorney, Agent, or Firm — JCIPRNET

(57) ABSTRACT

A memory device includes a stacked structure including a plurality of memory cells, and first and second flights of steps. The first flights of steps are disposed at an end of the stacked structure along the first direction. The second flights of steps are adjacent to the first flights of steps disposed at the end of the stacked structure along the first direction. The first flights of steps and the second flights of steps comprise first portions and second portions alternately disposed along the first direction. The second portions are wider than the first portions along the second direction.

20 Claims, 39 Drawing Sheets

Related U.S. Application Data

(60) Provisional application No. 63/057,892, filed on Jul. 29, 2020.

MEMORY DEVICE, SEMICONDUCTOR DEVICE, AND MANUFACTURING METHOD THEREOF

CROSS-REFERENCE TO RELATED APPLICATION

This application is a continuation application of and claims the priority benefit of a prior application Ser. No. 17/185,984, filed on Feb. 26, 2021. The prior application Ser. No. 17/185,984 claims the priority benefit of a provisional application Ser. No. 63/057,892, filed on Jul. 29, 2020. The entirety of the above-mentioned patent applications are hereby incorporated by reference herein and made a part of this specification.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM).

Both SRAM and DRAM are volatile because they will lose the information they store when they are not powered. On the other hand, non-volatile memories can keep data stored on them.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
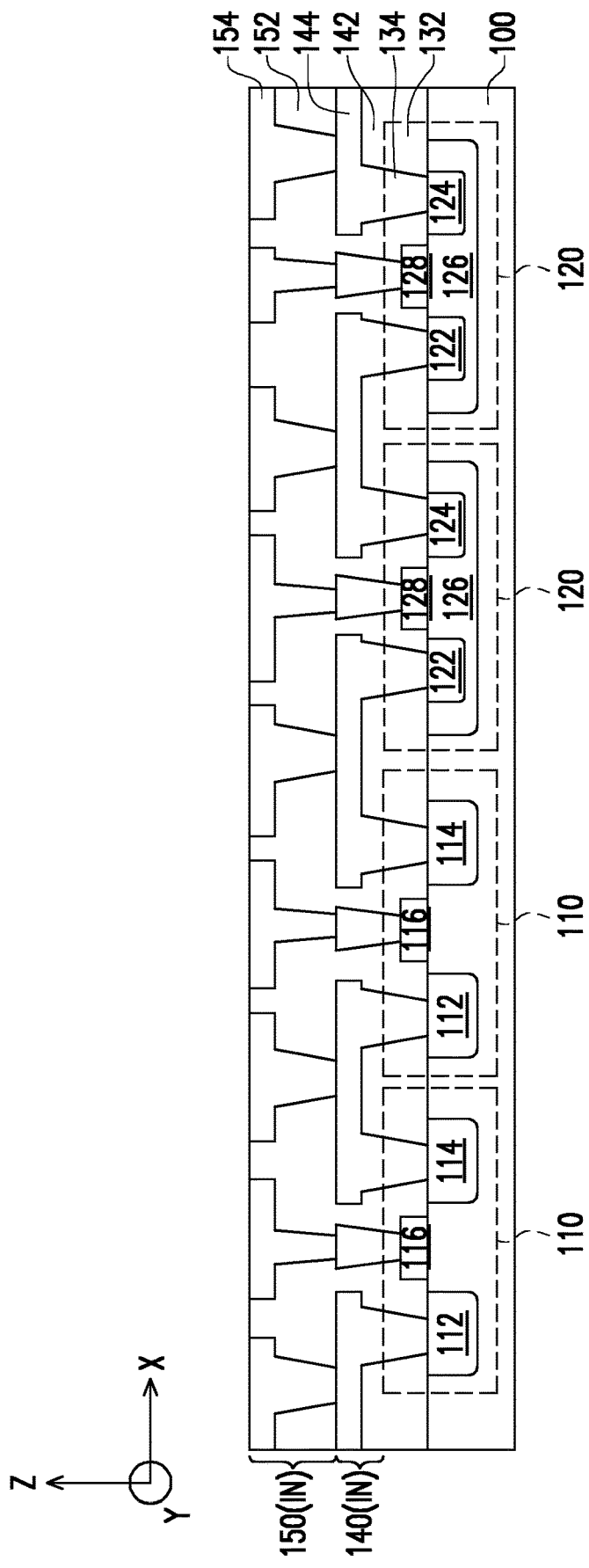
FIG. 1 is a schematic cross-sectional view of a structure formed during a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 28 are schematic views illustrating a manufacturing process of a semiconductor device D10 in accordance with some embodiments of the disclosure. In FIG. 1, a semiconductor substrate 100 is provided. In some embodiments, the semiconductor substrate 100 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 100 may be a semiconductor-on-insulator, including at least one layer of dielectric material (e.g., a buried oxide layer) disposed between a pair of semiconductor layers. FIG. 1 further illustrates circuits that may be formed over the semiconductor substrate 100. For example, in FIG. 1 are illustrated two transistors 110 and two transistors 120 formed in the semiconductor substrate 100. The transistors 110 include a pair of source and drain regions 112, 114 separated by a portion of semiconductor substrate 100 which functions as a channel region of the transistors 110. Gate structures 116 are disposed on the channel region in between the source and drain regions 112, 114. In some embodiments, the source and drain regions 112, 114 may be doped, for example with n-type materials or p-type materials. In some embodiments, the transistors 120 also include a pair of source and drain regions 122, 124, which may be optionally doped with n-type materials or p-type materials. In some embodiments, the source and drain regions 122, 124 are doped with materials of opposite conductivity type with respect to the source and drain regions 112, 114.

In some embodiments, the source and drain regions 122, 124 may be embedded in regions 126 of different composition. For example, the regions 126 may be doped with a material of opposite conductivity type with respect to the source and drain regions 122, 124, or the regions 126 may include a same dopant as the source and drain regions 122, 124, but in different concentration. For example, the source and drain regions 122, 124 may be doped with a p-type material, and the regions 126 may be doped with an n-type material. In some embodiments, gate structures 128 are disposed on the regions 126 in between the source and drain regions 122, 124. It should be noted that the disclosure does not limit the architecture of the transistors 110, 120, For example, the transistors 110, 120 may be planar field effect transistors, fin field effect transistors, gate all around transistors, or the like with different gate contact schemes (e.g., front-gate, back-gate, double-gate, staggered, and so on). Although in FIG. 1 are illustrated transistors formed over the semiconductor substrate 100, other active devices (e.g., diodes or the like) and/or passive devices (e.g., capacitors, resistors, or the like) may also be formed as part of the functional circuit.

An interlayer dielectric (ILD) 132 is formed on the semiconductor substrate 100. In some embodiments, the ILD 132 extends on the transistors 110, 120, and other devices which may be formed on the semiconductor substrate 100. In some embodiments, contact plugs 134 extend through the ILD 132 to electrically couple to the devices formed on the semiconductor substrate 100, for example to couple to the source/drain regions 112, 114, 122, 124 and the gate structures 116, 128 of the transistors 110, 120. In some embodiments, lower interconnection tiers 140, 150 of an interconnection structure IN are formed over the semiconductor substrate 100, for example on the ILD 132. In some embodiments, the interconnection tiers 140, 150 of the interconnection structure IN include ILDs 142, 152 and conductive patterns 144, 154 disposed on the corresponding ILDs 142, 152. For example, the bottommost tier 140 includes the ILD 142 and the conductive patterns 144 extending through the ILD 142 to land on the contact plugs 134, thus establishing electrical connection to the devices (e.g., the transistors 110, 120) formed on the semiconductor substrate 100. That is, the devices formed on the semiconductor substrate 100 may be interconnected by the interconnection structure IN to form one or more functional circuits. In some embodiments, the functional circuits formed by the interconnection structure IN may comprise logic circuits, memory circuits, sense amplifiers, controllers, input/output circuits, image sensor circuits, the like, or combinations thereof. Although FIG. 1 illustrates transistors formed over the semiconductor substrate 100, other active devices (e.g., diodes or the like) and/or passive devices (e.g., capacitors, resistors, or the like) may also be formed as part of the functional circuits. Additional interconnection tiers (e.g., the interconnection tier 150) may be stacked on the interconnection tier 140. When formed, the additional interconnection tier(s) include their own ILD(s) 152 and conductive patterns 154. It should be noted that while one additional interconnection tier 150 is illustrated in FIG. 1, the disclosure is not limited thereto. In some alternative embodiments, more or fewer additional interconnection tiers than the ones illustrated in FIG. 1 may be formed, according to routing and design requirements.

In some embodiments, the ILDs 132, 142, 152 may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the ILDs 132, 142, 152 may be fabricated to a suitable thickness by flowable CVD (FCVD), CVD, HDPCVD, SACVD, spin-on, sputtering, or other suitable methods. In some embodiments, the ILD of an interconnection tier (e.g., the ILD 142 of the interconnection tier 140) may be formed during multiple steps and be constituted by two or more layers which may include the same or different dielectric materials. In some embodiments, the conductive patterns 144, 154, may include aluminum, titanium, copper, nickel, tungsten, and/or alloys thereof, and may be fabricated through a sequence of deposition (e.g., CVD, plating, or other suitable processes) and planarization steps (e.g., chemical mechanical polishing). In some embodiments, the interconnection tiers 140, 150 of the interconnection structure IN may be formed via damascene, dual damascene, or other suitable processes. The position (in terms of level height with respect to the semiconductor substrate 100) of the boundaries between the ILDs 132, 142, 152 may depend on the process followed for the formation of the interconnection structure IN. For the sake of simplicity and clarity, in the following drawings a structure such as the one of FIG. 1 will be schematically illustrated as a single layer.

Figure 2:
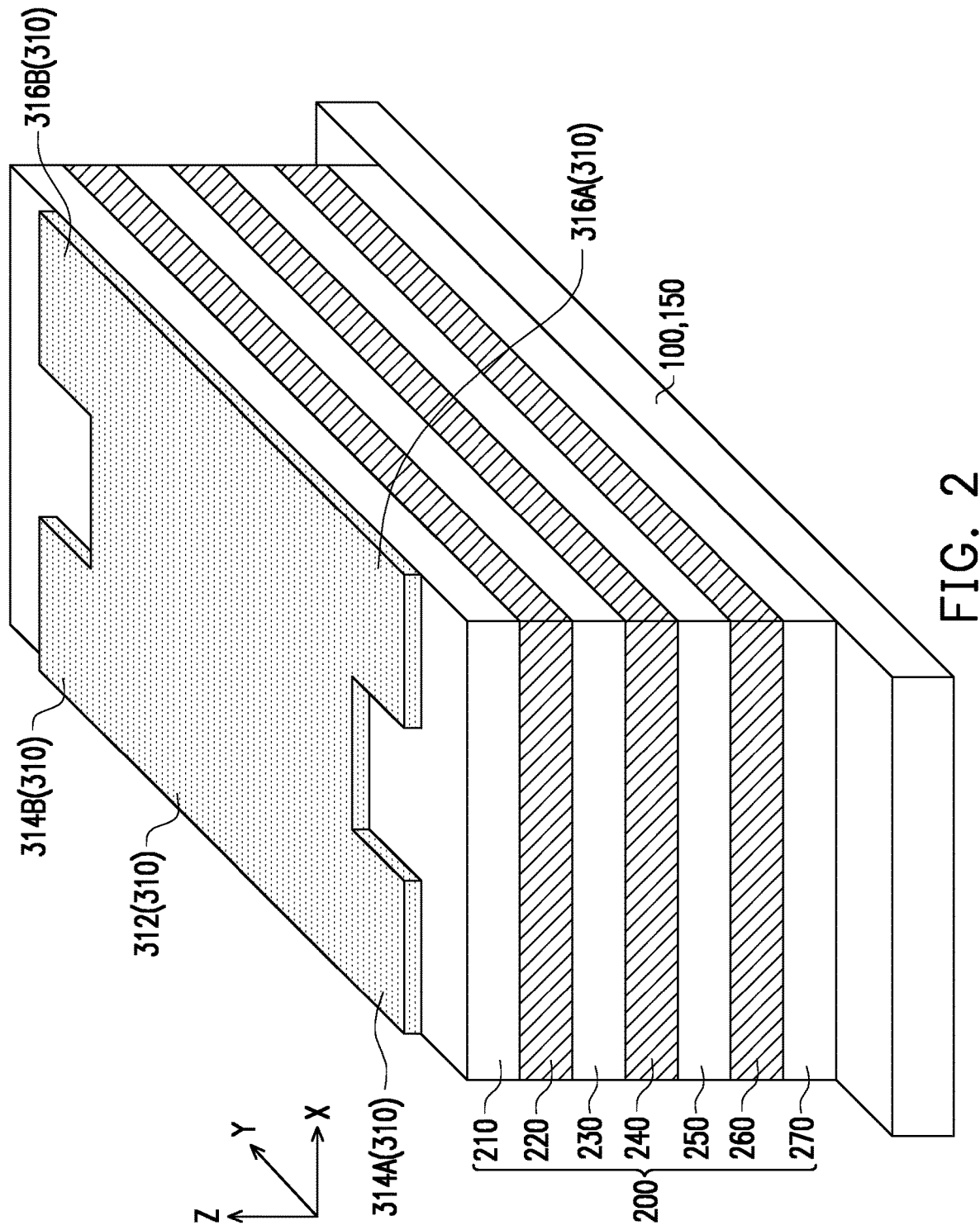
FIG. 2 to FIG. 28 are schematic perspective views of structures formed during a manufacturing process of a semiconductor device in accordance with some embodiments of the disclosure.

Referring to FIG. 1 and FIG. 2, a multi-layer stack 200 is formed over the semiconductor substrate 100. The multi-layer stack 200 includes alternating layers 220, 240, 260 of conductive material (sometimes referred to as conductive layers) and dielectric layers 210, 230, 250, 270. The conductive layers 220, 240, 260 may be considered to extend in planes defined by X and Y directions (e.g., XY planes) and may be alternately stacked with the dielectric layers 210, 230, 250, 270 along the Z direction, where the directions X, Y, and Z form an orthogonal set of Cartesian coordinates. The conductive layers 220, 240, 260 may comprise a conductive material such as copper, titanium, titanium nitride, tantalum, tantalum nitride, tungsten, ruthenium, aluminum, combinations thereof, or the like. The dielectric layers 210, 230, 250, 270 may comprise an insulating material, such as silicon oxide, silicon nitride, silicon oxynitride, combinations thereof, or the like. The conductive layers 220, 240, 260 and the dielectric layers 210, 230, 260, 270 may be each formed using, for example, chemical vapor deposition (CVD), atomic layer deposition (ALD), physical vapor deposition (PVD), plasma enhanced CVD (PECVD), or the like. In some embodiments, layers of sacrificial material (not shown) may be initially formed between the dielectric layers 210, 230, 250, 270, and the conductive layers 220, 240, 260 may be formed by substituting a conductive material in place of the originally formed sacrificial material. Although FIG. 2 illustrates the multi-layer stack 200 including a particular number of conductive layers and dielectric layers, in other embodiments a different number of conductive layers and dielectric layers may be included.

In some embodiments, a photoresist mask 310 is formed over the uppermost dielectric layer 210 of the multi-layer stack 200. The photoresist mask 310 may include a positive or a negative photoresist, and may be formed, for example, through a sequence of deposition (e.g., spin on), exposure, and development steps. In some embodiments, the photoresist mask 310 is patterned to expose regions of the uppermost dielectric layer 210. In some embodiments, the photoresist mask 310 has a central region 312 having a substantially rectangular shape, with rectangular arms 314, 316 protruding from opposite sides of the central region 312 along the Y direction. In the following, the letter "B" will be used to indicate elements (e.g., the arm 314B) formed on a side of the photoresist mask 310 or the multi-layer stack 200 further away along the Y direction than corresponding elements indicated with the letter "A" (e.g., the arm 314A). The letters "A" and "B" may be dropped when referring to such elements collectively (e.g., the arms 314). In some embodiments, the uppermost dielectric layer 210 is exposed at opposite sides of the photoresist mask 310, in areas where the arms 314, 316 do not extend.

Figure 3:
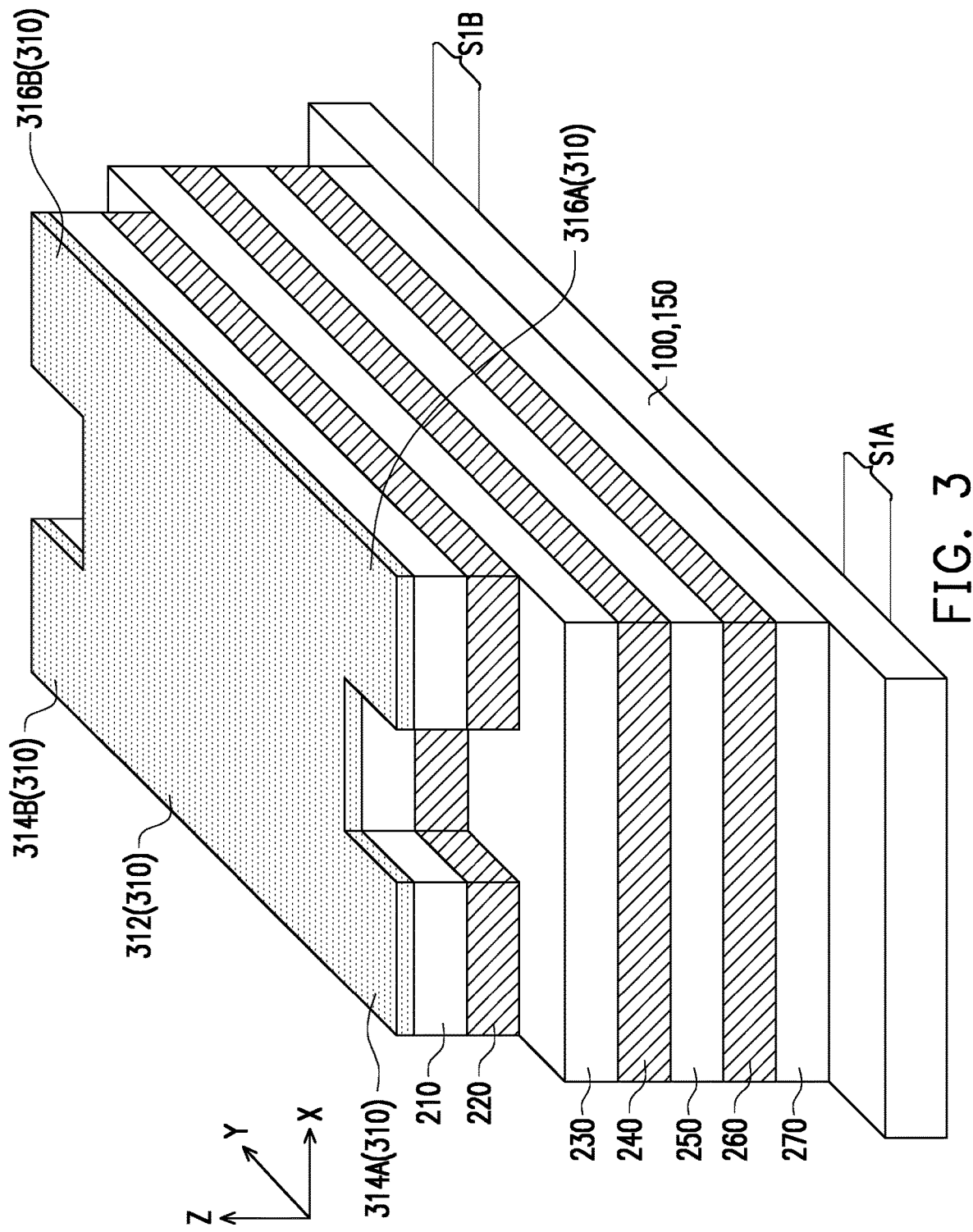

Referring to FIG. 3, the exposed portions of the uppermost dielectric layer 210 and the corresponding underlying regions of the conductive layer 220 are etched using the photoresist mask 310 as a mask. The etching may be any acceptable etch process, such as wet or dry etching, a reactive ion etch (RIE), neutral beam etch (NBE), the like, or a combination thereof. The etching may be anisotropic. After etching, the trimmed dielectric layer 210 and conductive layer 220 may remain on the dielectric layer 230 underneath the photoresist mask 310, while the dielectric layer 230 may be exposed where the steps S1 are formed. Because the conductive layer 220 and the dielectric layers 210, 230 have different material compositions, etchants used to remove exposed portions of such layers may be different. In some embodiments, the conductive layer 220 acts as an etch stop layer while etching dielectric layer 210, and the dielectric layer 230 acts as an etch stop layer while etching the conductive layer 220. As a result, the portions of the dielectric layer 210 and the conductive layer 220 may be selectively removed without removing the underlying layers 230, 240, 250, 260, 270, and the steps S1 may be extended to a desired depth along the Z direction. Alternatively, a timed etch process may be used to stop the etching after the steps S1 reach a desired depth.

Figure 4:
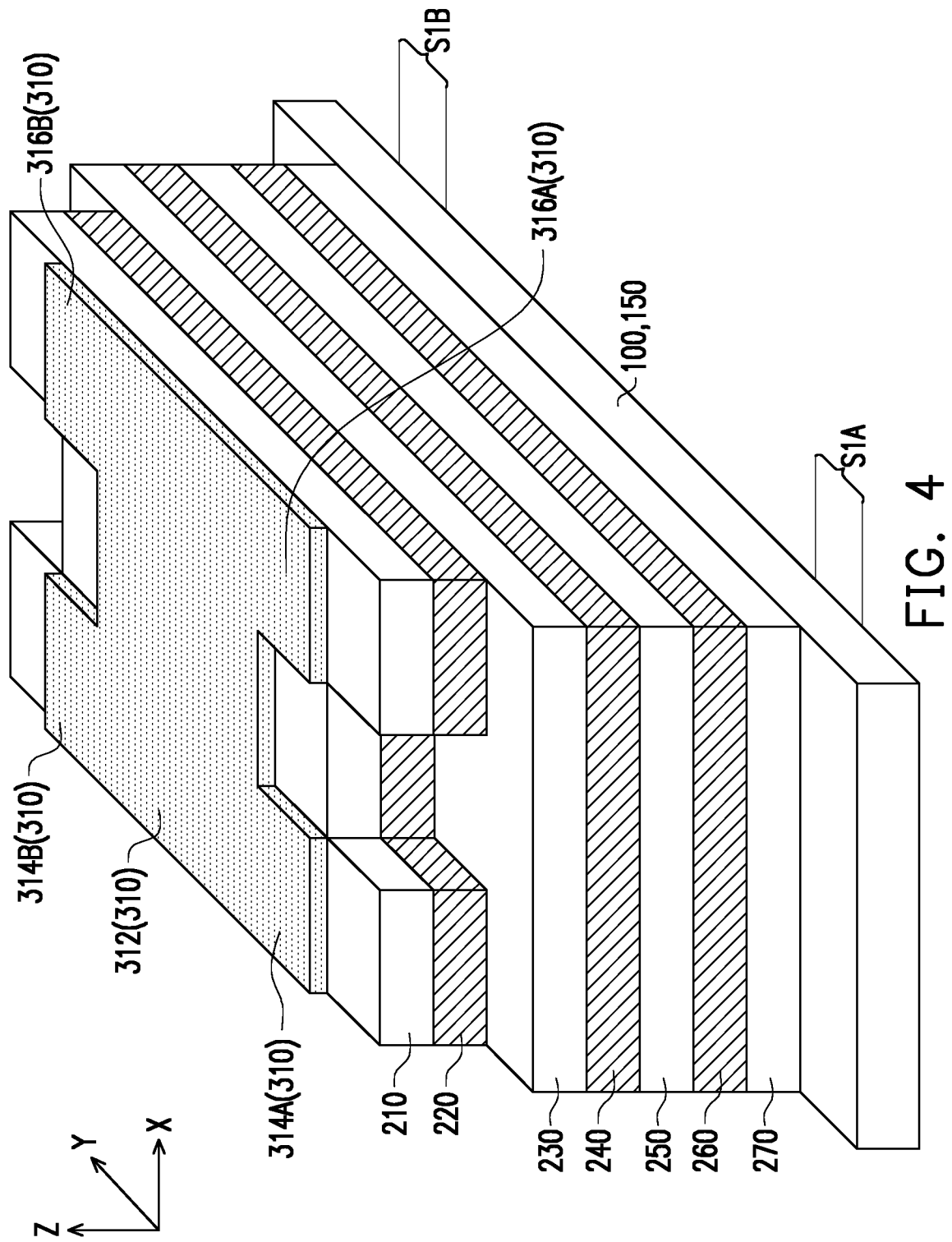
Figure 5:
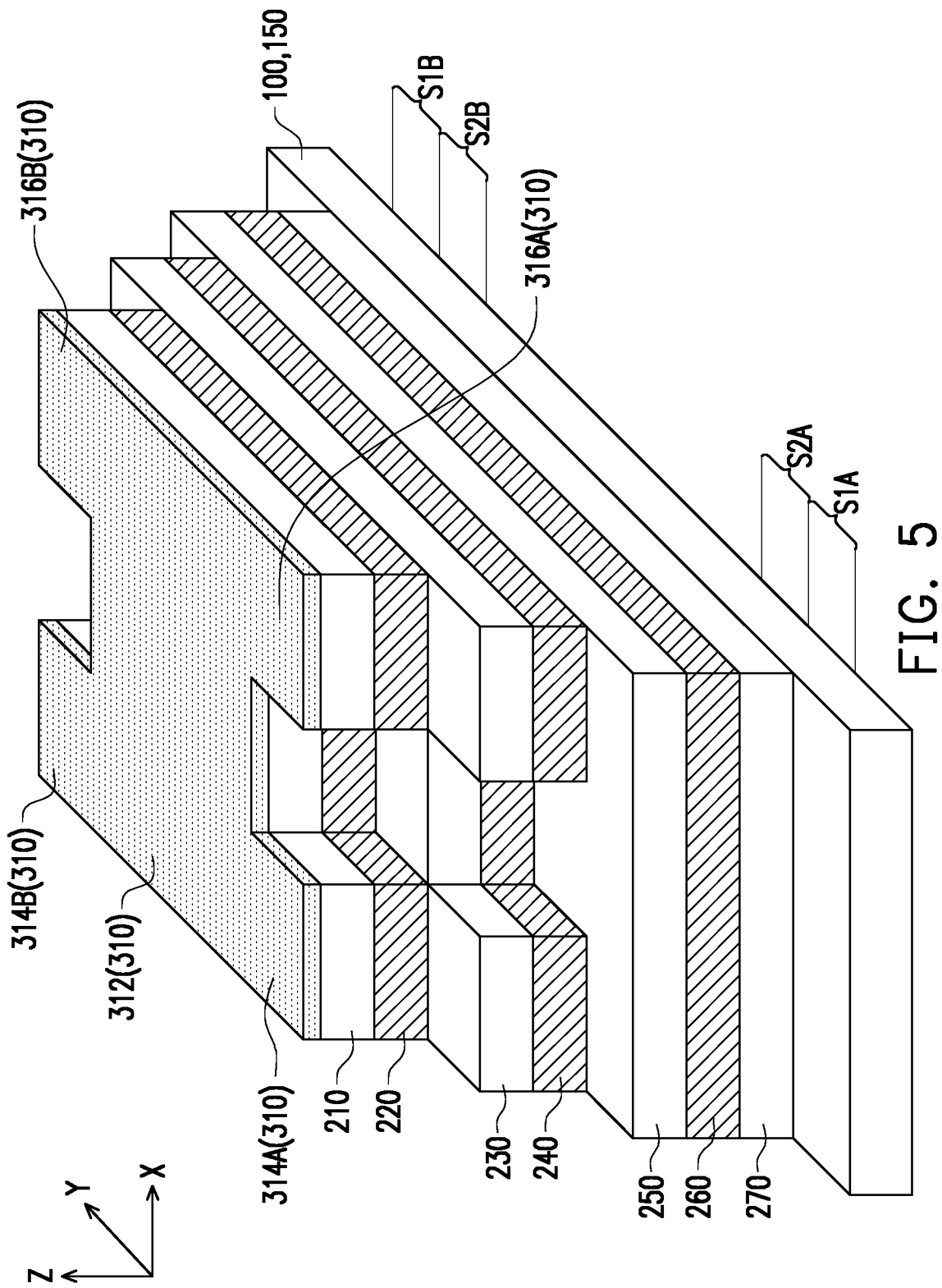

Referring to FIG. 4, the photoresist mask 310 is trimmed along the Y direction to expose additional regions of the dielectric layer 210. The photoresist mask M1 can be trimmed using acceptable photolithography techniques. As a result of the trimming, a top surface of the dielectric layer 210 may be initially exposed in the regions between the steps S1 and the photoresist mask 310, while a top surface of the dielectric layer 230 may be exposed in correspondence of the steps S1. In FIG. 5, the exposed portions of the dielectric layers 210, 230 and the corresponding underlying regions of the conductive layers 220, 240 are etched using the trimmed photoresist mask 310 as a mask. The etching may be any acceptable etch process, such as wet or dry etching, a reactive ion etch (RIE), neutral beam etch (NBE), the like, or a combination thereof. The etching may be anisotropic. The etching may extend the steps S1 along the Z direction, while forming steps S2 beside the step S1 along the Y direction. Because the conductive layers 220, 240 and the dielectric layers 210, 230 have different material compositions, etchants used to remove exposed portions of these layers may be different. In some embodiments, the conductive layer 220 acts as an etch stop layer while etching the dielectric layer 210 where the steps S2 are to be formed, and the dielectric layer 230 acts as an etch stop layer while etching the conductive layer 220 to form the steps S2. Similarly, the conductive layer 240 acts as an etch stop layer while removing portions of the dielectric layer 230 to extend the step S1 along the Z direction, and the dielectric layer 250 acts as an etch stop layer when removing portions of the conductive layer 240. As a result, portions of the conductive layers 220, 240 and the dielectric layers 210, 230 may be selectively removed without removing the underlying layers 250, 260, 270, so that the steps S2 may be formed to a desired depth along the Z direction and the steps S1 may also be extended to a desired depth. The depth of the step S1 along the Z direction is larger than the depth of the step S2. In some embodiments, the step S2 may be formed at the same time as the step S1 is extended along the Z direction. That is, the dielectric layer 210 may be etched at the same time as the dielectric layer 230, and the conductive layer 220 may be etched at the same time as the conductive layer 240. In the resulting structure, the dielectric layer 230 is exposed in correspondence of the steps S2, and the dielectric layer 250 is exposed in correspondence of the steps S1.

Figure 6:
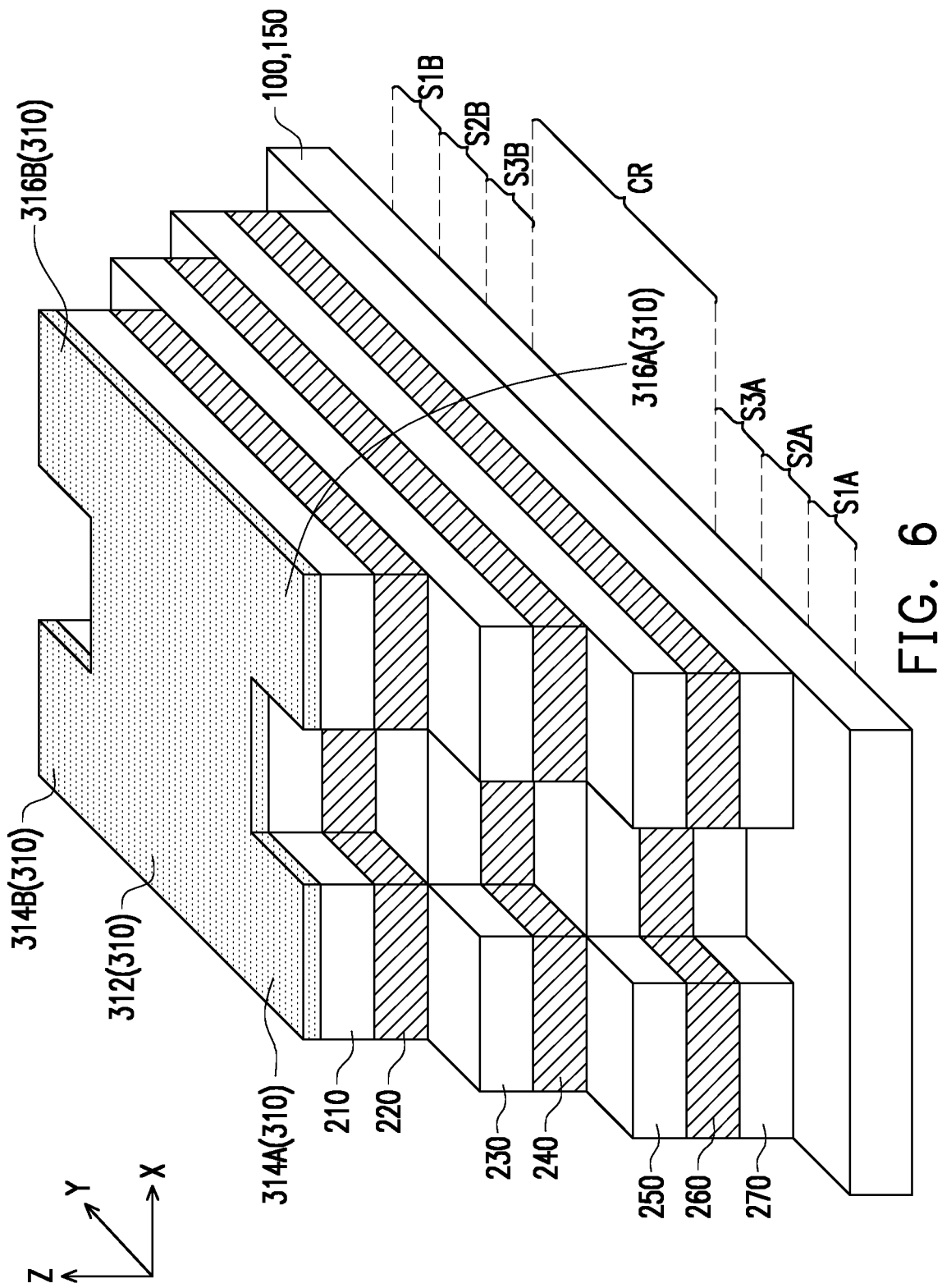

Referring to FIG. 5 and FIG. 6, the processes previously described with reference to FIGS. 4 and 5 are repeated again to obtain the multi-layered structure 202. Briefly, the photoresist mask 310 is further trimmed along the Y direction, to expose additional portions of the dielectric layer 210. The photoresist mask 310 can be trimmed using acceptable photolithography techniques. As a result of the trimming, a top surface of the dielectric layer 210 may be initially exposed in the regions between the steps S2 and the photoresist mask 310, while a top surface of the dielectric layer 230 is exposed in correspondence of the steps S2 and a top surface of the dielectric layer 250 may be exposed in correspondence of the steps S1. Then, the exposed portions of the dielectric layers 210, 230, 250 are removed, for example via an etching process using the photoresist mask 310 as a mask. The etching may be any acceptable etch process, such as by wet or dry etching, a reactive ion etch (RIE), neutral beam etch (NBE), the like, or a combination thereof. The etching may be anisotropic. As a result of the etching, the layers 250, 260, 270 in correspondence of the original step S1 may be removed, and the original step S2 may be extended to the layers 250, 260, 270 and be the step S1 of the structure of FIG. 6. After the last etching, in correspondence of the (new) step S1 the dielectric layer 250 is exposed, in correspondence of the (new) step S2 the dielectric layer 230 is exposed, and in correspondence of the (new) step S3 the photoresist mask 310 remains.

Figure 7:
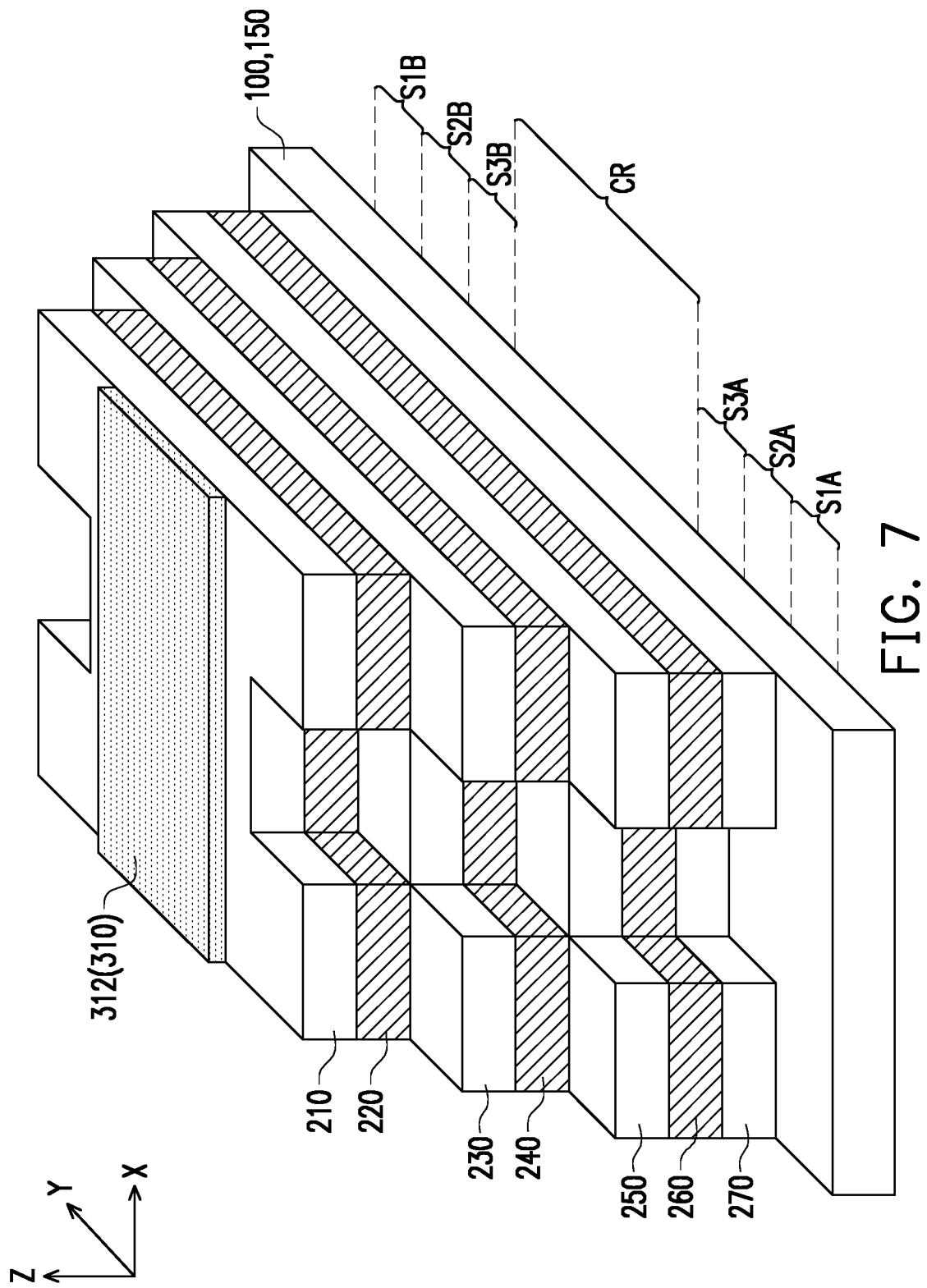

In FIG. 7, the photoresist mask 310 is further trimmed along the Y direction, to expose additional portions of the dielectric layer 210 in correspondence of the steps S3. The photoresist mask 310 can be trimmed using acceptable photolithography techniques. As a result of the trimming, a top surface of the dielectric layer 210 may be initially exposed in the regions between the steps S2 and the photoresist mask 310, while a top surface of the dielectric layer 230 is exposed in correspondence of the steps S2 and a top surface of the dielectric layer 250 is exposed in correspondence of the steps S1. Following the further trimming of the photoresist mask 310, the arms 314, 316 may be completely removed, while the central region 312 of the photoresist mask 310 remains on the cell region CR of the multi-layered structure 202.

Figure 8:
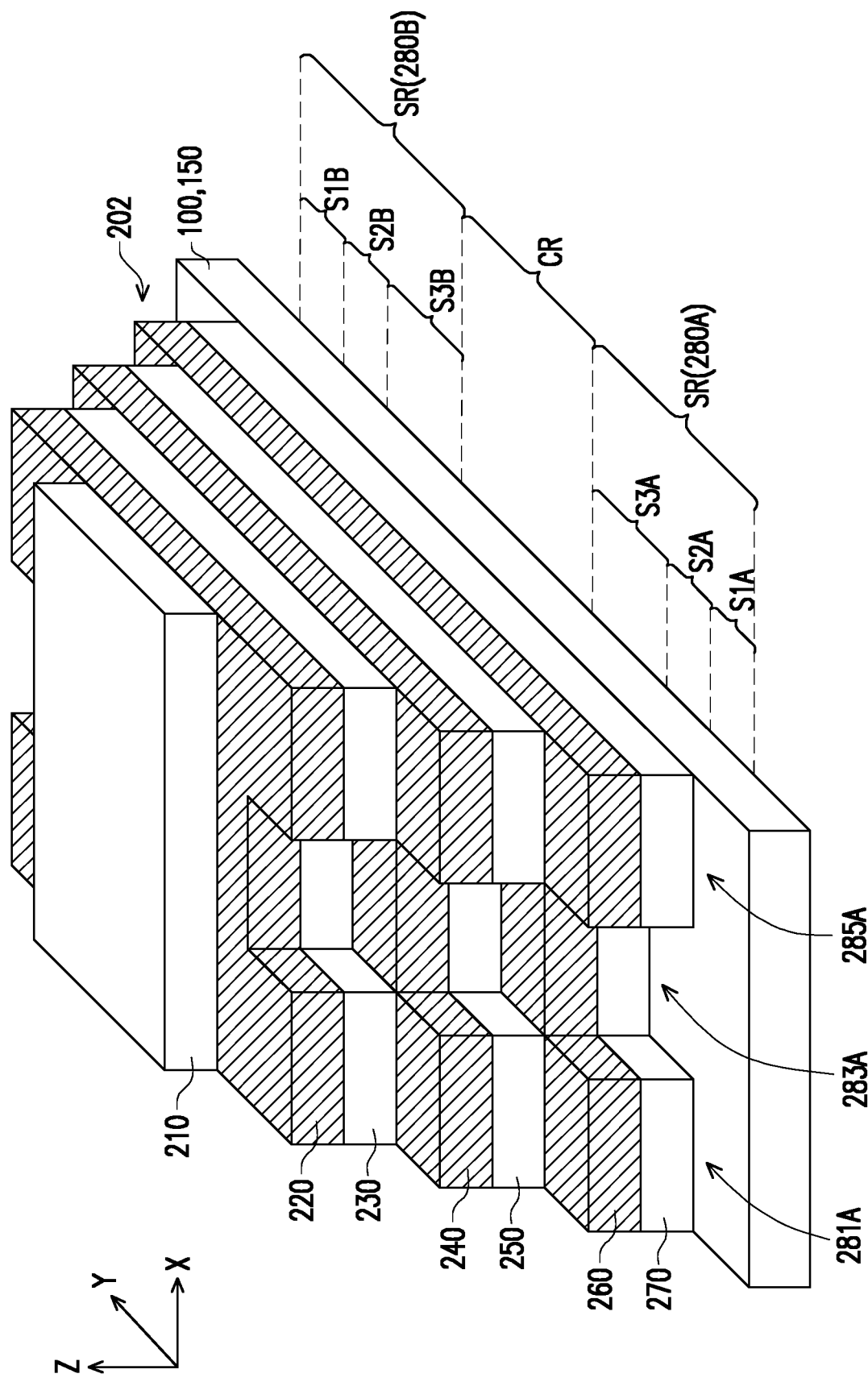

Referring to FIG. 7 and FIG. 8, the exposed portions of the dielectric layers 210, 230, 250 may be removed, for example via an etching process using the photoresist mask 300 as a mask. The etching may be any acceptable etch process, such as by wet or dry etching, a reactive ion etch (RIE), neutral beam etch (NBE), the like, or a combination thereof. The etching may be anisotropic. The etching may extend the steps S1, S2, and S3 along the Z direction. The underlying conductive layers 220, 240, 260 may be used as etch stop layers during etching of the dielectric layers 210, 230, 250. In some embodiments, the photoresist mask 310 may then be removed, for example via stripping or ashing, to expose the remaining portion of the dielectric layer 210, as illustrated, e.g., in FIG. 8. Once the conductive layers 220, 240, 260 are exposed, staircases 280 including the sets of steps S1, S2, S3, are formed at opposite sides of the cell region CR where the original layers 210, 220, 230, 240, 250, 260, 270 remains. The staircases 280 include the sets of steps S1, S2, S3 formed in the step regions SR, at opposite sides along the Y direction of the cell region CR. At the steps S1, the top surface of the conductive layer 260 is exposed. At the steps S2, the top surface of the conductive layer 240 is exposed. At the steps S3, the top surface of the conductive layer 220 is exposed. The top surface of the dielectric layer 210 is exposed in the cell region CR. In the multi-layered structure 202 precursor flights 281, 283, 285 of rectangular steps S1-S3 are formed. The steps S1-S3 of adjacent precursor flights 281, 283, 285 may have a rectangular shape, and be formed at different level heights along the Y direction. For examples, the steps S1-S3 of the precursor flights 281, 285 may protrude along the Y direction with respect to the corresponding steps S1-S3 of the precursor flight 283. It will be apparent that while the staircases 280 have been described as including three steps S1, S2, S3, the disclosure is not limited thereto. By stacking an adequate number of layers in the multi-layer stack 200 of FIG. 2 and by repeating for a sufficient number of times the photoresist trimming/ layer etching process sequence described in FIG. 3 to FIG. 6, multi-layered structures 202 including staircases 280 of any desired number of steps may be formed, according to routing and production requirements.

Figure 9:
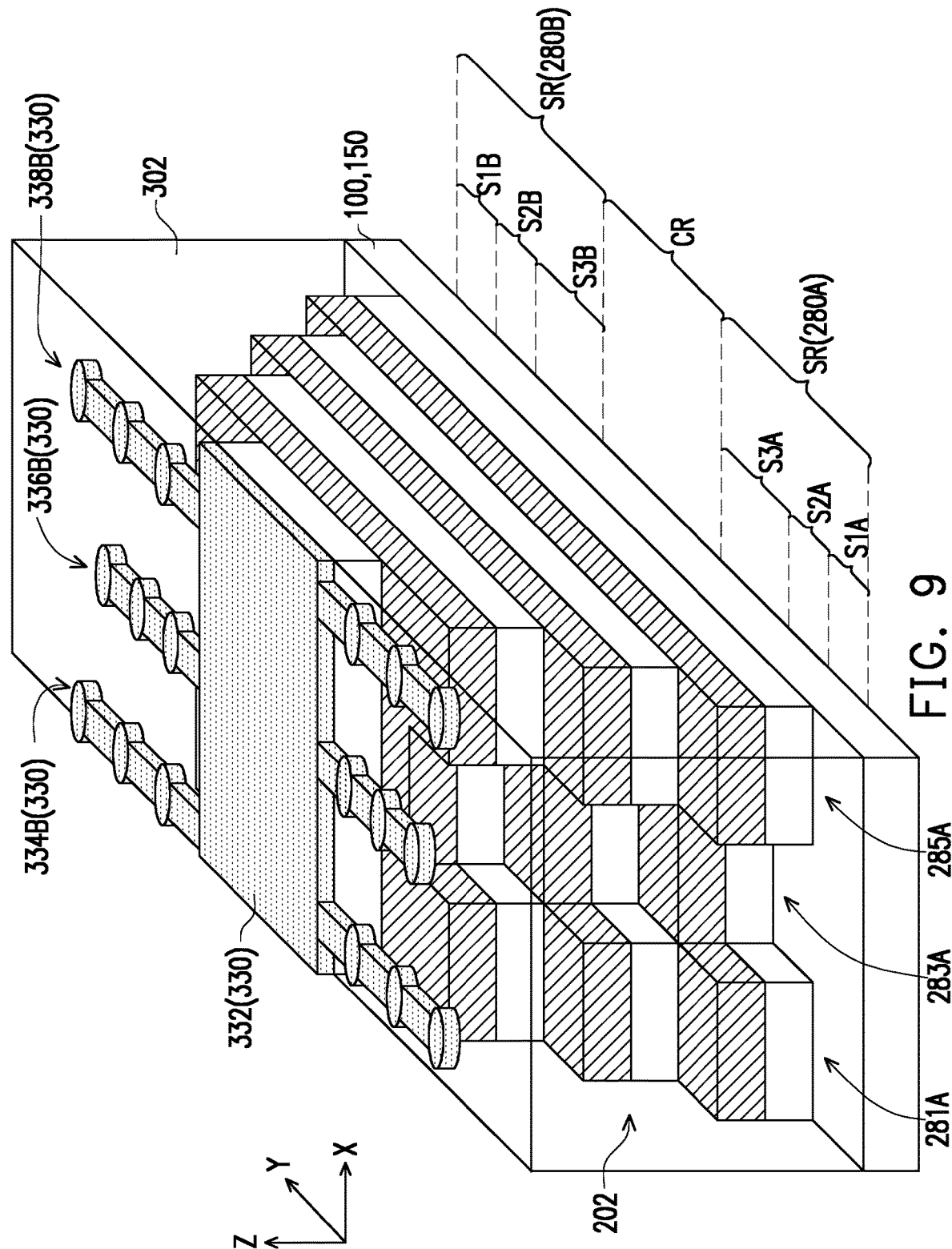

In FIG. 9, the multi-layered structure 202 may first be encapsulated in an ILD 302, and then a photoresist mask 330 may be formed on the dielectric layer 210 and the ILD 302. The ILD 302 may be formed so as to initially bury the entire multi-layered structure 202, and a planarization process may then be performed until the uppermost dielectric layer 210 is exposed. The photoresist mask 330 may then be formed on the planarized ILD 302. The photoresist mask 330 may include a rectangular central region 332 overlying the cell region CR and arms 334, 336, 338 extending along the Y direction at opposite sides of the central region 332. The arms 334, 336, 338 include thicker and thinner portions alternately arranged.

Figure 10:
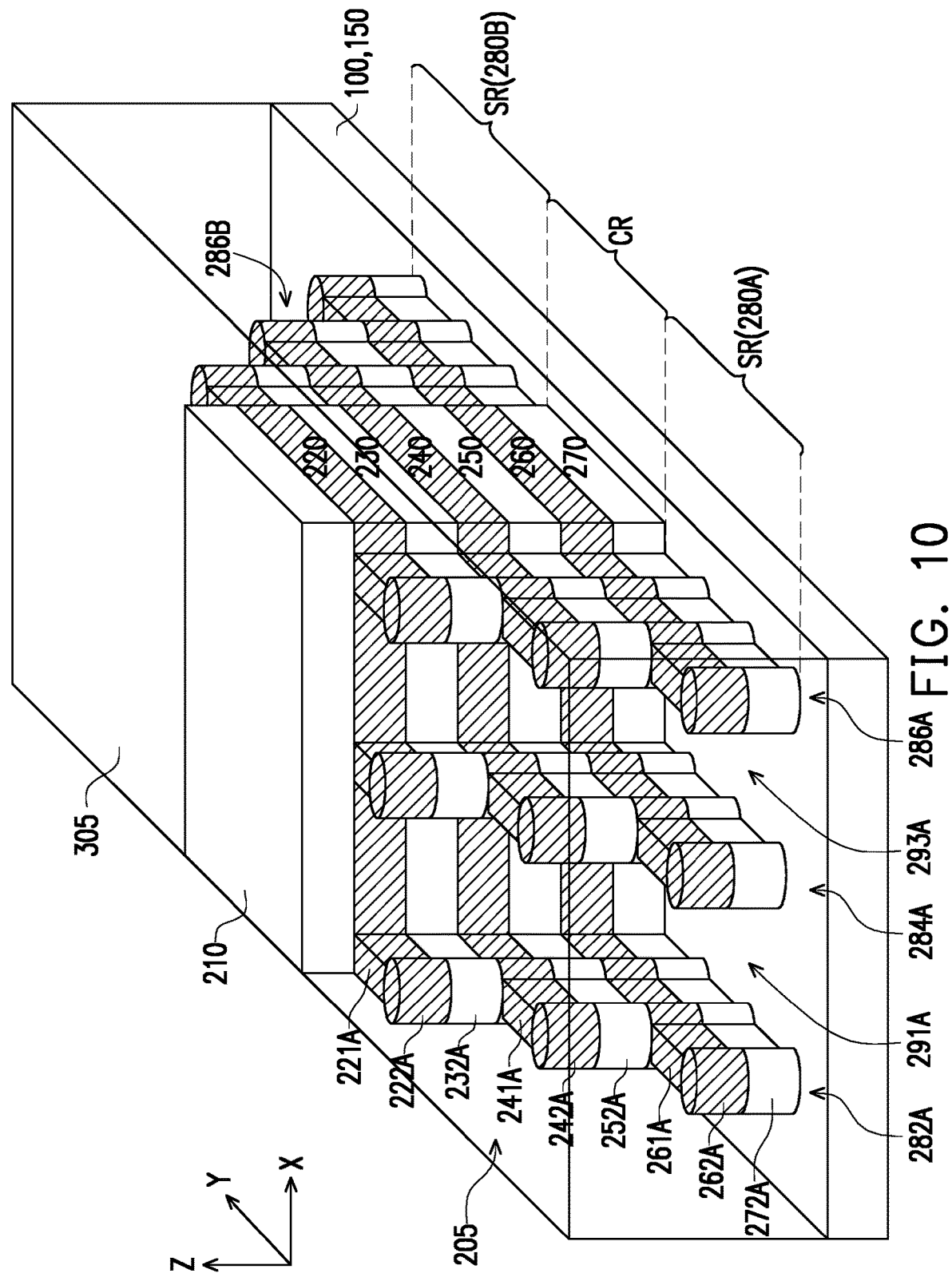
Figure 11A:
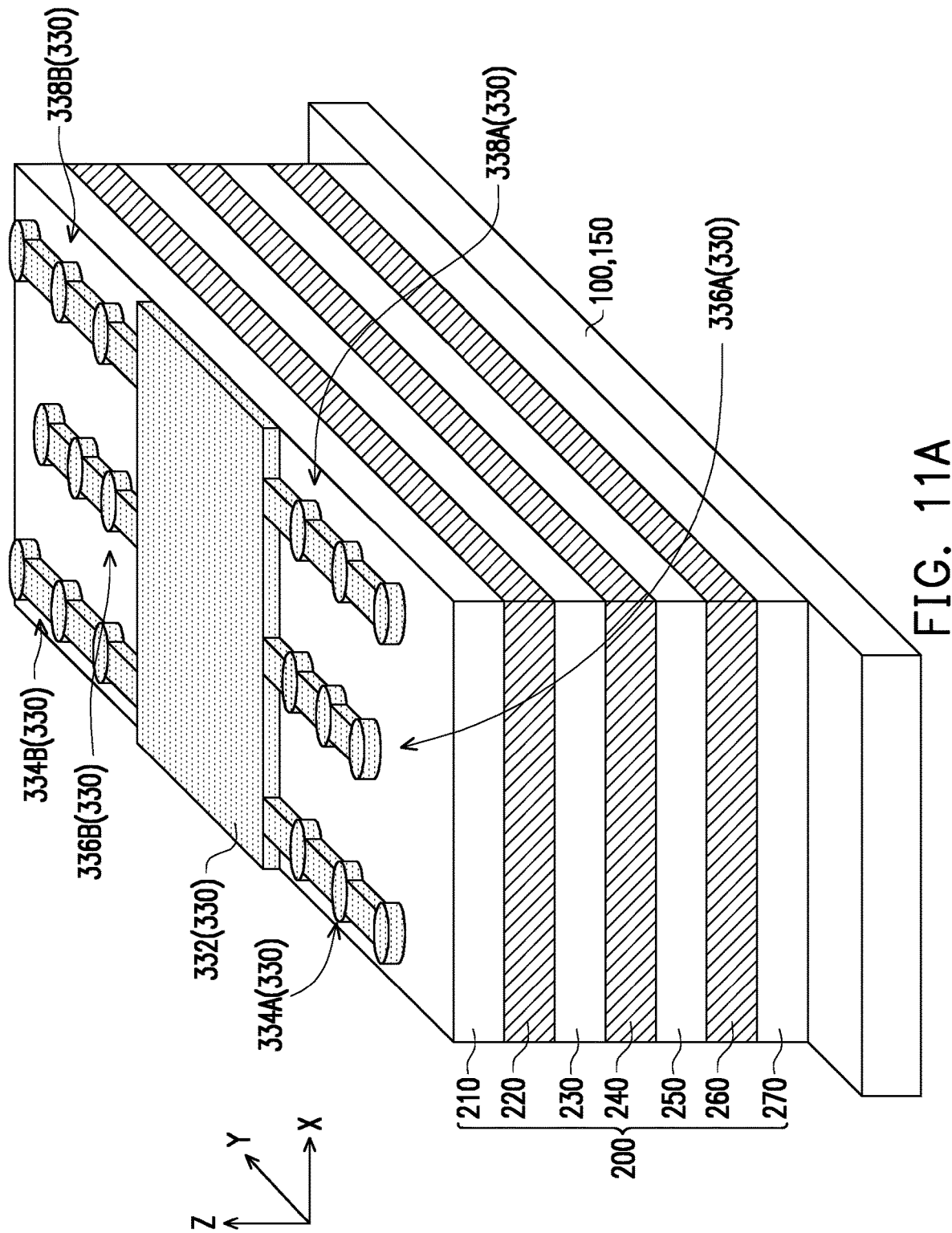
Figure 11B:
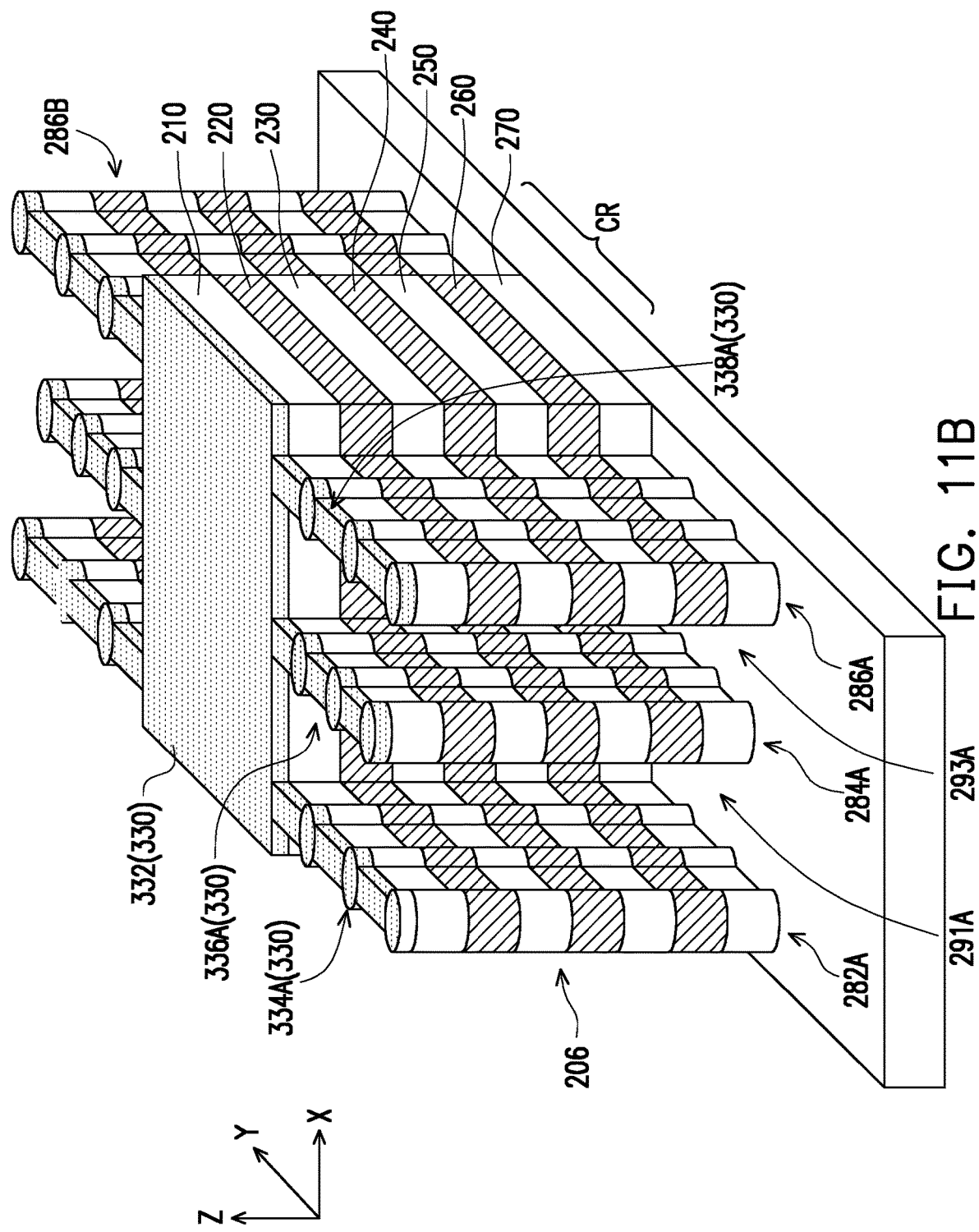
Figure 11C:
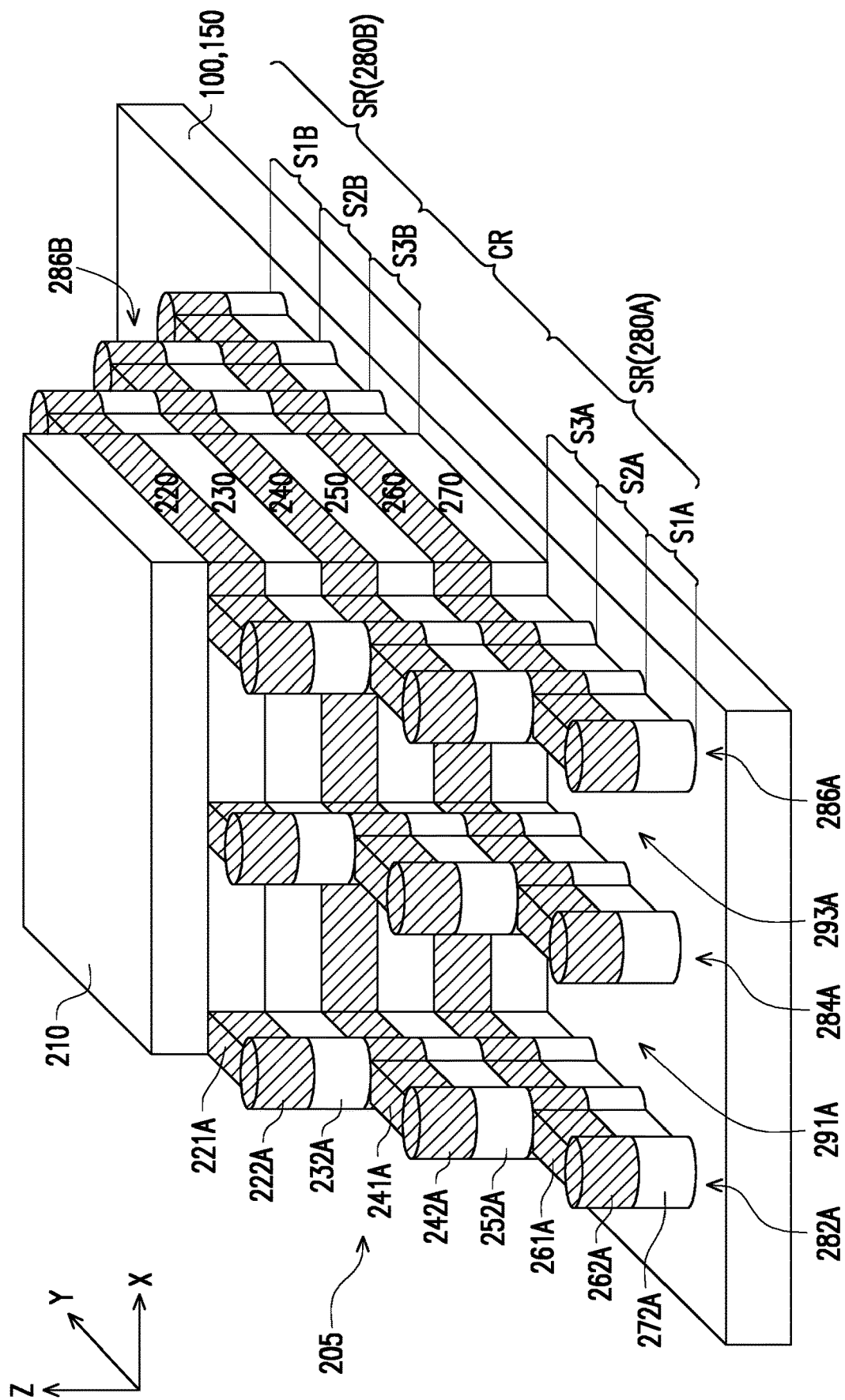

Referring to FIG. 9 and FIG. 10, the pattern of the photoresist mask 330 is transferred to the multi-layered structure 202, for example via one or more etching steps. Upon etching the multi-layered structure 202, portions of the ILD 302 may remain on flights 282, 284, 286 of steps S1-S3, while the portions of the ILD 302 in between the flights 282, 284, 286 may be removed during the etching step, to form the trenches 291, 293. After patterning, the photoresist mask 330 is removed, and an ILD 305 is formed over the semiconductor substrate 100, to fill the trenches 291, 293 in between the flights 282, 284, 286.

While a certain process has been illustrated in FIG. 2 to FIG. 10 to form the multi-layered structure 205 including the staircases 280, the disclosure is not limited thereto, and some alternative processes may be followed. For example, referring to FIG. 11A to FIG. 11C, the photoresist mask 330 may be directly formed on the multi-layer stack 200, and a multi-layered structure 206 may be formed from the multi-layer stack 200, by transferring the pattern of the photoresist mask 330 to the multi-layered stack 200. The multi-layered structure 206 may then be patterned, for example by sequential trimming of the photoresist mask 330 and etching, to obtain the shape of the staircases 280 (illustrated, e.g., in FIG. 10). Encapsulation of the multi-layered structure 205 in the ILD 305 (illustrated, e.g., in FIG. 10) results in the structure of FIG. 10.

Figure 29A:
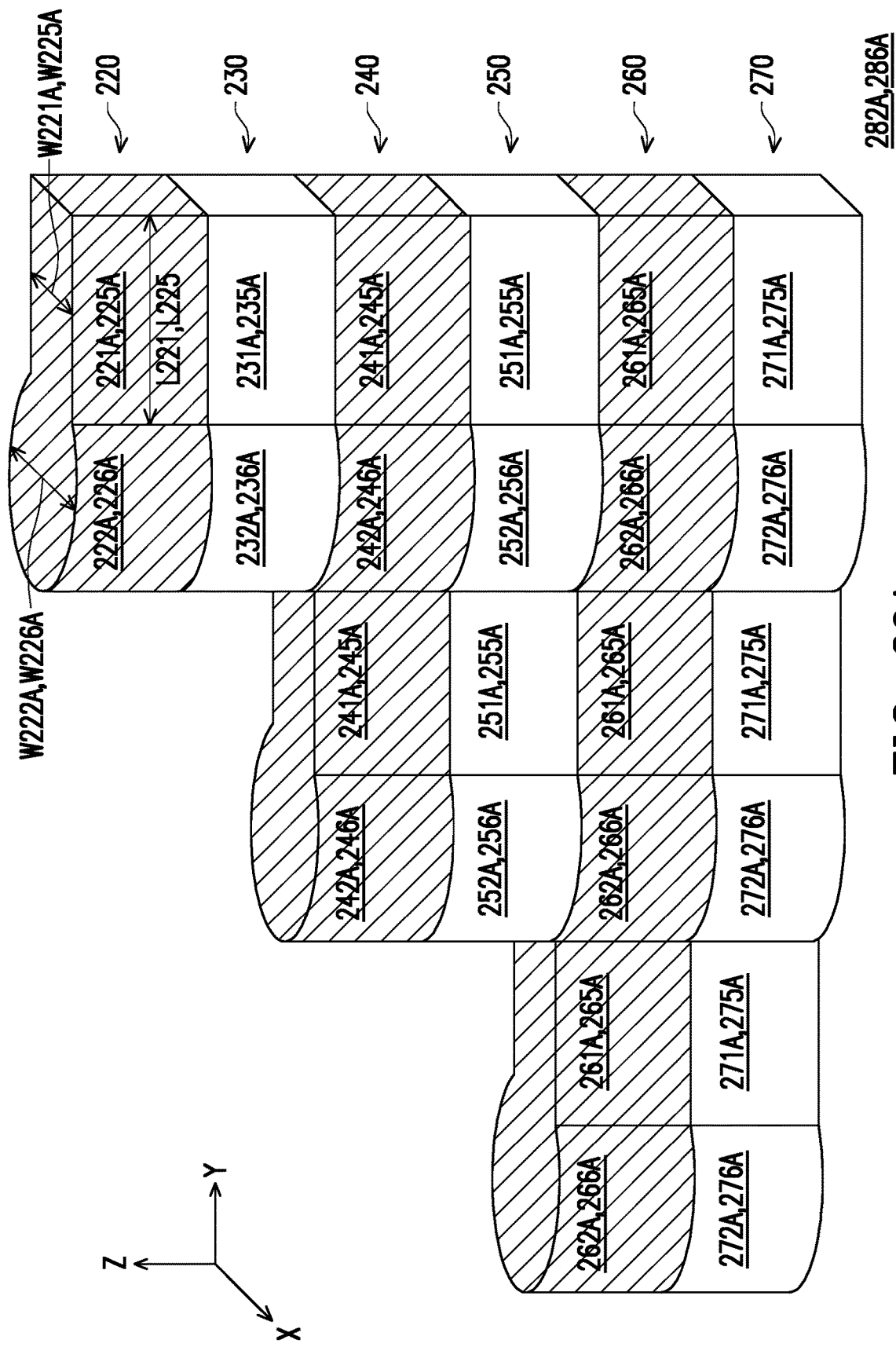
FIG. 29A and FIG. 29B are schematic perspective views of flights of staircases according to some embodiments of the disclosure.
Figure 29B:
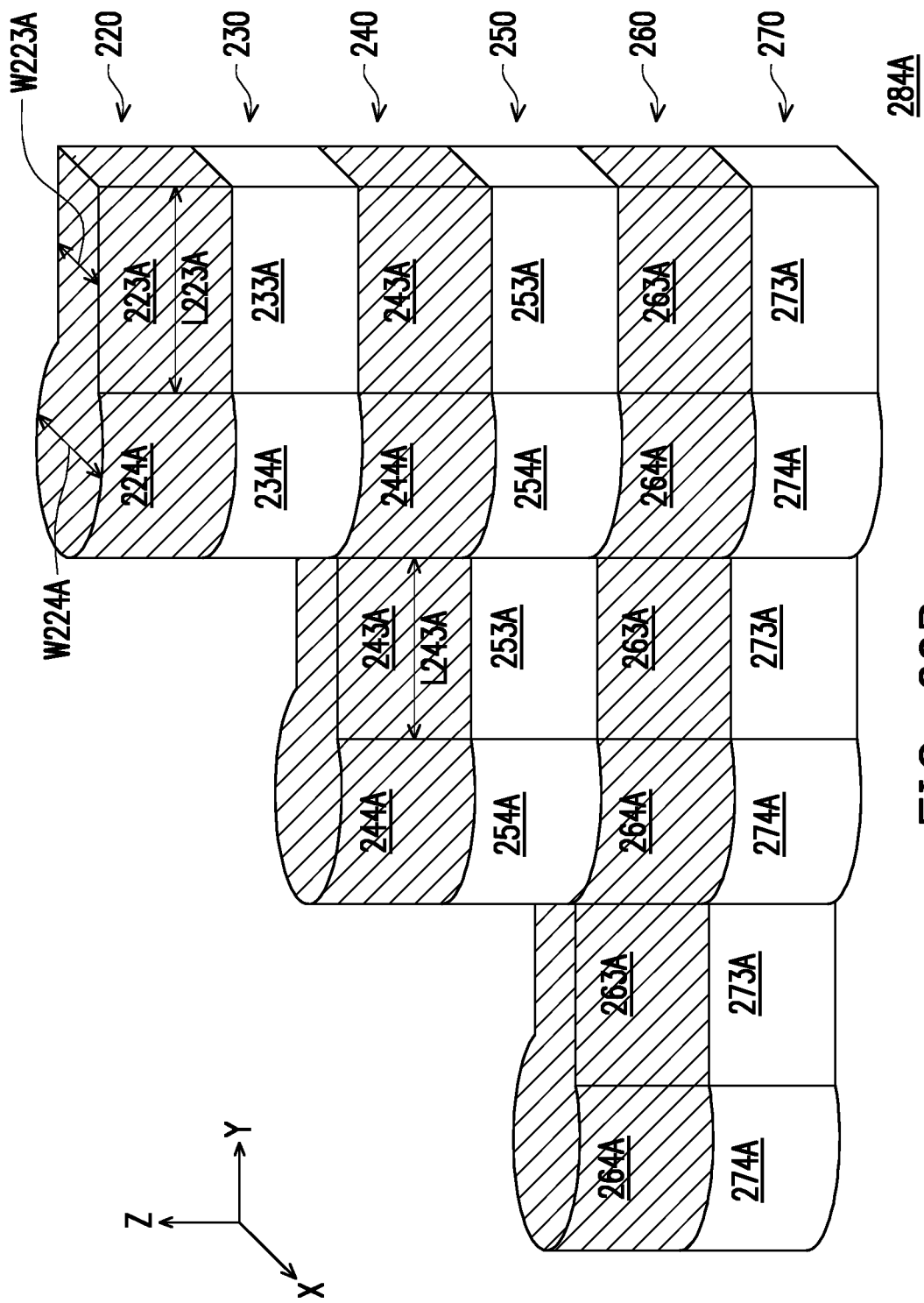

In the following, some aspects of the multi-layered structure 205 and its staircases 280 according to some embodiments of the disclosure will be described with reference to FIG. 10, FIG. 29A, and FIG. 29B. FIG. 29A and FIG. 29B are schematic perspective views of the flights 282A, 284A, 286A according to some embodiments of the disclosure. In some embodiments, the multi-layered structure 205 has in the step regions SR flights 282, 284, 286 of steps S1, S2, S3 at opposite sides of the cell region CR. That is, multiple flights 282, 284, 286 of steps S1, S2, S3 are formed in each staircase 280. So, for example, the staircase 280A includes the flights 282A, 284A, and 286A and the staircase 280B includes the flights 282B, 284B, 286B. In some embodiments, the flights 282, 284, 286 of steps S1, S2, S3 extend along the Y direction, and are separated from each other along the X direction by the trenches 291, 293. In some embodiments, the steps S1, S2, S3 of the flights 282, 284, 286 are formed so that thinner connective lines (e.g., the connective lines 221A, 241A, 261A) and wider landing pads (e.g., the landing pads 222A, 242A, 262A) are alternately disposed along the Y direction, where the widths of the connective lines and the landing pads is measured along the X direction. Taking as an example the conductive layer 220, the conductive layer 220 has been patterned to extend only until the steps S3. In correspondence of the flights 282, the conductive layer 220 has been patterned to form a connective line 221 extending from the cell region CR up to a landing pad 222. In correspondence of the flights 284, the conductive layer 220 has been patterned to form a connective line 223 extending from the cell region CR up to a landing pad 224. In correspondence of the flights 286, the conductive layer 220 has been patterned to form a connective line 225 extending from the cell region CR up to a landing pad 226. The top surfaces of the connective lines 221, 223, 225 and landing pads 222, 224, 226 are exposed at the steps S3. In some embodiments, the connective lines 221, 223, 225 may have widths W221, W223, W225 along the X direction smaller than the widths W222, W224, W226 of the corresponding landing pads 222, 224, 226. In some embodiment, the ratio of the width of a landing pad (e.g., the width W222A of the landing pad 222A) to the width of the connective line to which the landing pad is attached (e.g., the width 221A of the connective line 221A) may be greater than 1, for example up to about 1000. In some embodiments, the widths of the landing pads (e.g., 222, 224, 226) and the connective lines (e.g., 221, 223, 225) may independently be in the range from 1 nm to 1000 nm.

In some embodiments, the layers 230, 240, 250, 260, 270 of the multi-layered structure 205 may be patterned to have the same shape as the corresponding portions of the overlying layers. Taking the flight 282A as an example, in correspondence of the step S3A, the underlying layers 230, 240, 250, 260, 270 are patterned so as to have the same shape as the conductive layer 220. For example, underneath the connective line 221A are stacked, in order, the isolation line 231A formed from the dielectric layer 230, the connective line 241A formed from the conductive layer 240, the isolation line 251A formed from the dielectric layer 250, the connective line 261A formed from the conductive layer 260, and the isolation line 271A formed from the dielectric layer 270. Similarly, below the landing pad 222A may be sequentially stacked the isolation pad 232A formed from the dielectric layer 230, the landing pad 242A formed from the conductive layer 240, the isolation pad 252A formed from the dielectric layer 250, the landing pad 262A formed from the conductive layer 260, and the isolation pad 272A formed from the dielectric layer 270. In correspondence of the step S2, where the conductive layer 220 and the dielectric layer 230 do not extend, top surfaces of a connective line 241A and a landing pad 242A are exposed. Under the connective line 241A whose top surface is exposed at the step S2A are stacked, in order, an isolation line 251A, a connective line 261A, and an isolation line 271A, and under the landing pad 242A whose top surface is exposed at the step S2A are stacked, in order, an isolation pad 252A, a landing pad 262A, and an isolation pad 272A. In correspondence of the step S1A, where the conductive layer 240 and the dielectric layer 250 do not extend, top surfaces of a connective line 261A and a landing pad 262A are exposed. Stacked below the connective line 261A and the landing pad 262A of the step S1A are an isolation line 271A and an isolation pad 272A, respectively. The other flights 284A, 286A (as well as the flights formed on the opposite side of the cell region CR such as the flight 286B) have a similar structure to the structure just described for the flight 282A. In some embodiments, the layers (e.g., the conductive layer 260) closer to the semiconductor substrate 100 along the Z direction may include multiple connective lines (e.g., the connective lines 261A) alternately disposed with the landing pads (e.g., 262A), even though only the ones further away along the Y direction from the cell region CR may be exposed by the overlying layers. On the other hand, the layers stacked higher along the Z direction (e.g., closer to the top of the staircases 280, closer to the dielectric layer 210, such as, for example, the conductive layer 220) may include fewer connective lines (e.g., 221A) and landing pads (e.g., 222A) than the underlying layers. In some embodiments, the landing pads of a flight (e.g. the landing pads 222, 242, 262 of the flights 282) may have the same width (e.g. W222) along the X direction and the conductive lines of a flight (e.g., the connective lines 221, 241, 261 of the flight 282) may have the same width (e.g., W221) along the X direction. Similarly, the conductive lines of a flight (e.g., the connective lines 221, 241, 261 of the flight 282) may have the same length (e.g., L221) along the Y direction. That is, landing pads (e.g., 242 or 262) and conductive lines (e.g., 241 or 261) belonging to a same conductive layer (e.g., 240 or 260) may have the same dimensions. In some embodiments, the flights 284, 286 may have similar structures to the ones described above for the flights 282. Briefly, in the flights 284, connective lines 223, 243, 263 are alternately stacked along the Z direction with isolation lines 233, 253, 273 and the connective lines 223, 243, 263 and the isolation lines 233, 253, 273 alternate along the Y direction with landing pads 224, 244, 264 and isolation pads 234, 254, 274, respectively. Similarly, in the flights 286, connective lines 225, 245, 265 are alternately stacked along the Z direction with isolation lines 235, 255, 275 and the connective lines 225, 245, 265 and the isolation lines 235, 255, 275 alternate along the Y direction with landing pads 226, 246, 266 and isolation pads 236, 256, 276, respectively.

In some embodiments, the connective lines of adjacent flights of steps S1-S3 may have a have different length along the extension direction of the flights (e.g., the Y direction). For example, the length L221A of the connective lines 221A of the flight 282A may be greater than the length L223A of the connective lines 223A of the flight 284A. Similarly, the length L225A of the connective lines 225A of the flight 286A may, in turn, be greater than the length L223A of the connective lines 223A. That is, the landing pads of the flight 282A (e.g., the landing pads 222A, 242A, 262A) and of the flight 286A (e.g., the landing pads 226A, 246A, 266A) may be further away along the Y direction from the cell region CR than the landing pads of the flight 284A (e.g., the landing pads 224A, 244A, 264A). That is, the landing pads of adjacent flights (e.g. the landing pads 222, 242, 262 of the flights 282 and the landing pads 224, 244, 264 of the flight 284) may be disposed in a staggered configuration with respect to the extension direction of the flights (e.g., the Y direction for the flights 282, 284). In some embodiments, ratios of the length L221A to the length L223A and L225A to L223A may independently be up to about 1000. In some embodiments, the lengths of the connective lines (e.g., L221, L223, L225) may independently be in the range from 1 nm to 1000 nm. In some embodiments, non-consecutive flights (e.g., 282 and 286) of steps S1-S3 may have the same shape. For example, the flights 282 and 286 may have same widths W221A, W225A of the connective lines 221, 225, same widths W222A, W226A of the landing pads, and same lengths L221A, L225A of the connective lines 221, 225. However, the disclosure is not limited thereto, and in some alternative embodiments, non-consecutive flights (e.g., 282, 286) may have different shapes (e.g., different widths W221, W225A or W222A, W226A, and so on). In some embodiments, the connective lines of steps S1-S3 of a same flight may have different lengths along the Y direction. For example, in the flight 284, the connective lines 223 and 243 at the step S3 have a length L223 along the Y direction shorter than the length L243 of the connective lines 243 at the step S2 (or of the connective lines 263 at the step S1). By doing so, the landing pads 224, 244, 264 may be disposed in a staggered configuration with respect to the landing pads 222, 242, 262, 226, 246, 266 of the adjacent flights 282, 286. In some embodiments, the length L243 may be substantially equal to the length L221.

Figure 12:
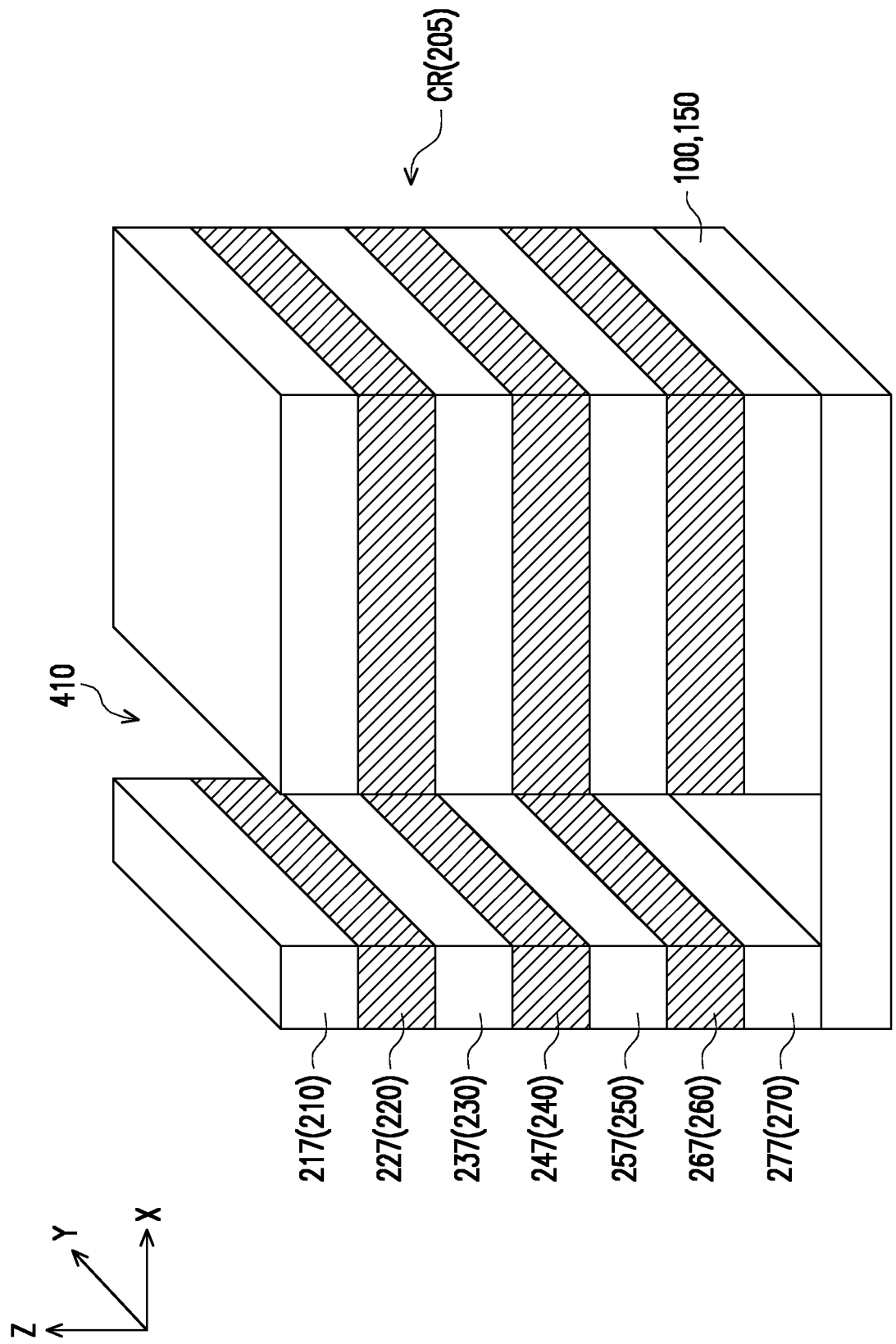

In FIG. 12 to FIG. 24, only the cell region CR of the multi-layered structure 205 is illustrated for the purpose of clarity and simplicity, while the staircases 280 are omitted. In some embodiments, a trench 410 is formed in the cell region CR of the multi-layered structure 205, as illustrated in FIG. 12. The trench 410 may extend throughout all the layers 210, 220, 230, 240, 250, 260, 270 of the multi-layered structure 205. At the bottom of the trench 410 may be exposed, for example, the interconnection tier 150, while along the sidewalls of the trench 410 are exposed portions of the conductive layers 220, 240, 260 and the dielectric layers 210, 230, 250, 270. In some embodiments, the trench 410 is formed in the cell region CR at a level height along the X direction intermediate between the position of the flights 282 and the flights 284 of the staircases 280 (illustrated, e.g., in FIG. 11). In some embodiments, the trench 410 may be formed using one or more acceptable etching processes, such as wet or dry etching, a reactive ion etch (RIE), neutral beam etch (NBE), the like, or a combination thereof. In some embodiments, one or more auxiliary masks (e.g., photoresist mask, hard mask, etc., not shown) may be used to define the form of the trench 410.

In some embodiments, upon opening of the trench 410 vertically stacked gate lines 227, 247, 267 are formed from the conductive layers 220, 240, 260, respectively. The gate lines 227, 247, 267 are separated from each other by isolation lines 237, 257 formed from the dielectric layers 230, 270. In addition, an isolation line 217 is formed on top of the gate line 227 from the dielectric layer 210 and an isolation line 277 is formed between the gate line 267 and the interconnection tier 150 from the dielectric layer 270. The gate lines 227, 247, 267 are connected at opposite ends along the Y direction to the flights 282 (illustrated, e.g., in FIG. 11). For example, referring to FIG. 12 and FIG. 29A, opposite ends of the gate line 227 are connected to the connective lines 221, opposite ends of the gate line 247 are connected to the connective lines 241, and opposite ends of the gate line 267 are connected to the connective lines 261.

Figure 13:
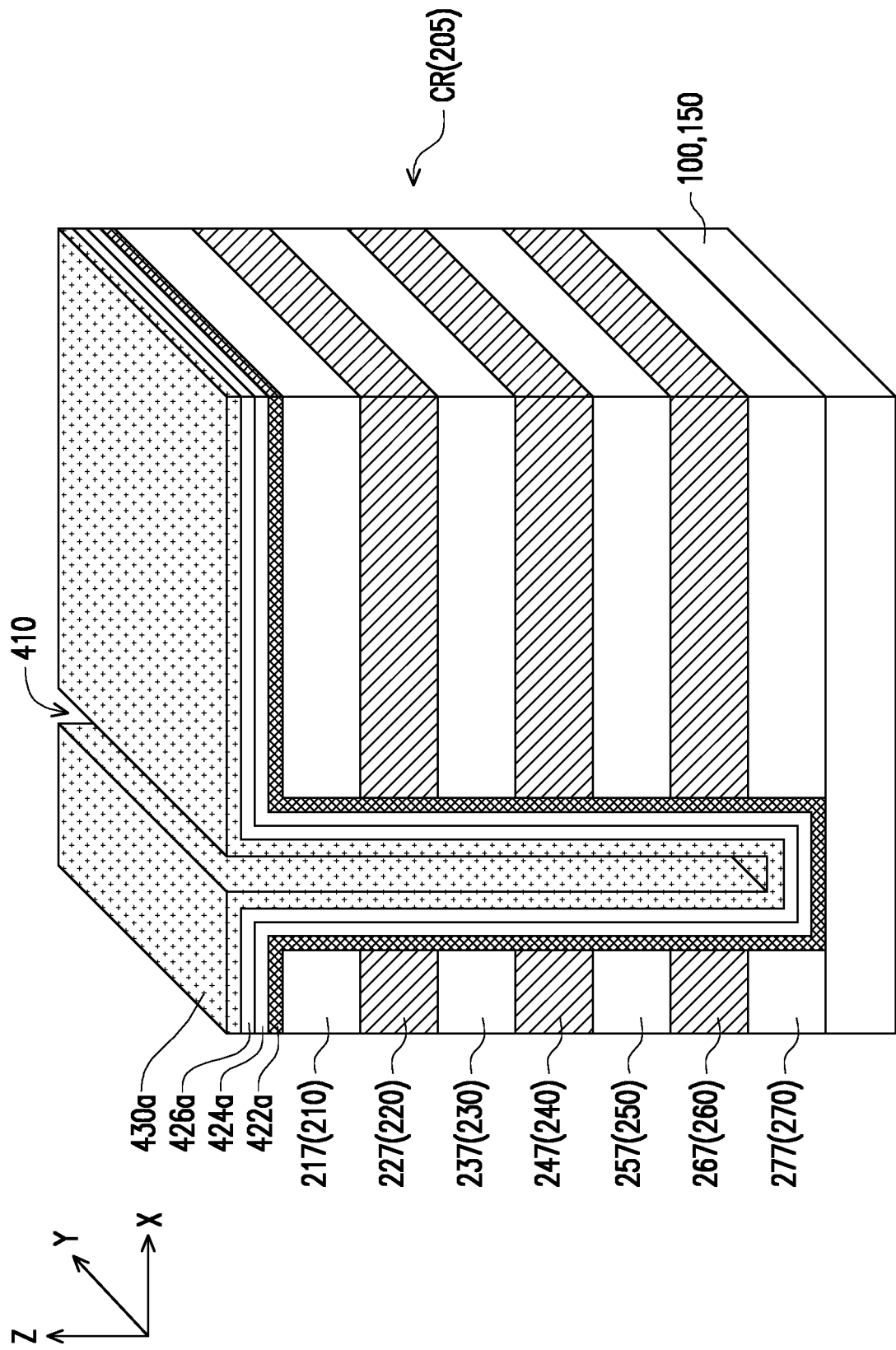

In FIG. 13, a memory blanket layer 422a, a channel blanket layer 424a, a cap blanket layer 426a and an isolation blanket layer 430a are sequentially formed on the multi-layered structure 205, being conformally disposed in the trench 410. For example, the memory blanket layer 422a extends on the dielectric layer 210 and along the sidewalls and on the bottom of the trench 410, contacting the conductive layers 220, 240, 260. The channel blanket layer 424a, the cap blanket layer 426a, and the isolation blanket layer 430a are conformally stacked, in order, on the memory blanket layer 422a.

The memory blanket layer 422a may have a material that is capable of storing a bit, such as a material capable of switching between two different polarization directions by applying an appropriate voltage differential across the memory blanket layer 422a. For example, the polarization of the memory blanket layer 422a may change due to an electric field resulting from applying the voltage differential. In some embodiments, the memory blanket layer 422a may be a layer of high-k dielectric material, such as a hafnium (Hf) based dielectric material, or the like. In some embodiments, the memory blanket layer 422a comprises a ferroelectric material, such as, hafnium oxide, hafnium zirconium oxide, silicon-doped hafnium oxide, or the like. In other embodiments, the memory blanket layer 422a may be a multilayer structure comprising a layer of SiNx between two SiOx layers (e.g., an ONO structure). In still other embodiments, the memory blanket layer 422a may comprise a different ferroelectric material or a different type of memory material. The memory blanket layer 422a may be deposited by CVD, PVD, ALD, PECVD, or the like to extend along sidewalls and a bottom surface of the trenches 410. After the memory blanket layer 422a is deposited, an annealing step may be optionally performed to achieve a desired crystalline lattice structure for the memory blanket layer 422a.

In some embodiments, the channel blanket layer 424a includes a material suitable for providing a channel region for a thin film transistor. For example, the channel blanket layer 424a includes a semiconductor oxide material. In some embodiments, the channel blanket layer 424a includes a ternary or higher (e.g., quaternary and so on) semiconductor oxide material, such as indium gallium zinc oxide (IGZO), indium zinc oxide (IZO), or indium tin oxide (ITO). In some embodiments, the channel blanket layer 424a comprises an indium-comprising material, such as $In_xGa_yZn_zMO$, where M may be Ti, Al, Ag, Si, Sn, or the like. The coefficients x, y, and z may each be any value between 0 and 1. In some embodiments, the material of the channel blanket layer 424a may be deposited by suitable techniques, such as CVD, ALD, PVD, PECVD, epitaxy, or the like.

In some embodiments, the cap blanket layer 426a includes a high-k dielectric material. For example, the material of the cap blanket layer 426a has a dielectric constant greater than about 4, greater than about 12, greater than about 16, or even greater than about 20. For example, a material of the cap blanket layer 426a may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfiO, or a combination thereof. In some alternative embodiments, the cap blanket layer 426a may optionally include a silicate such as HfSiO, HfSiON LaSiO, AlSiO, or a combination thereof. In some embodiments, the cap blanket layer 426a includes a different material than the memory blanket layer 422a. In some embodiments, the material of the cap blanket layer 426a has a greater dielectric constant than the material of the memory blanket layer 422a. In some embodiments, the higher the dielectric constant of the cap blanket layer 426a, the more the applied voltage differential during write operation will affect the polarization of the memory blanket layer 422a. However, the disclosure is not limited thereto. In some alternative embodiments, the material of the cap blanket layer 426a may have a dielectric constant substantially equal to or even lower than the material of the memory blanket layer 422a. In some embodiments, the material of the cap blanket layer 426a may be selected balancing the requirements of reliability of operation of the memory blanket layer 422a with requirements of etching performances for the cap blanket layer 426a. In some embodiments, the method of forming the cap blanket layer 426a includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, the isolation blanket layer 430a includes, for example, silicon oxide, silicon nitride, silicon oxynitride, silicon carbonitride, silicon oxycarbonitride, or any other suitable dielectric material (e.g., dielectric polymers or the like), which may be deposited by CVD, PVD, ALD, PECVD, spin-coating, or the like. In some embodiments, the combined thicknesses of the memory blanket layer 422a, the channel blanket layer 424a, the cap blanket layer 426a and the isolation blanket layer 430a may be such that a central region of the trench 410 remains not filled, while the stacked layers 422a, 424a, 426a, 430a extend on the sidewalls and at the bottom of the trench 410.

Figure 14:
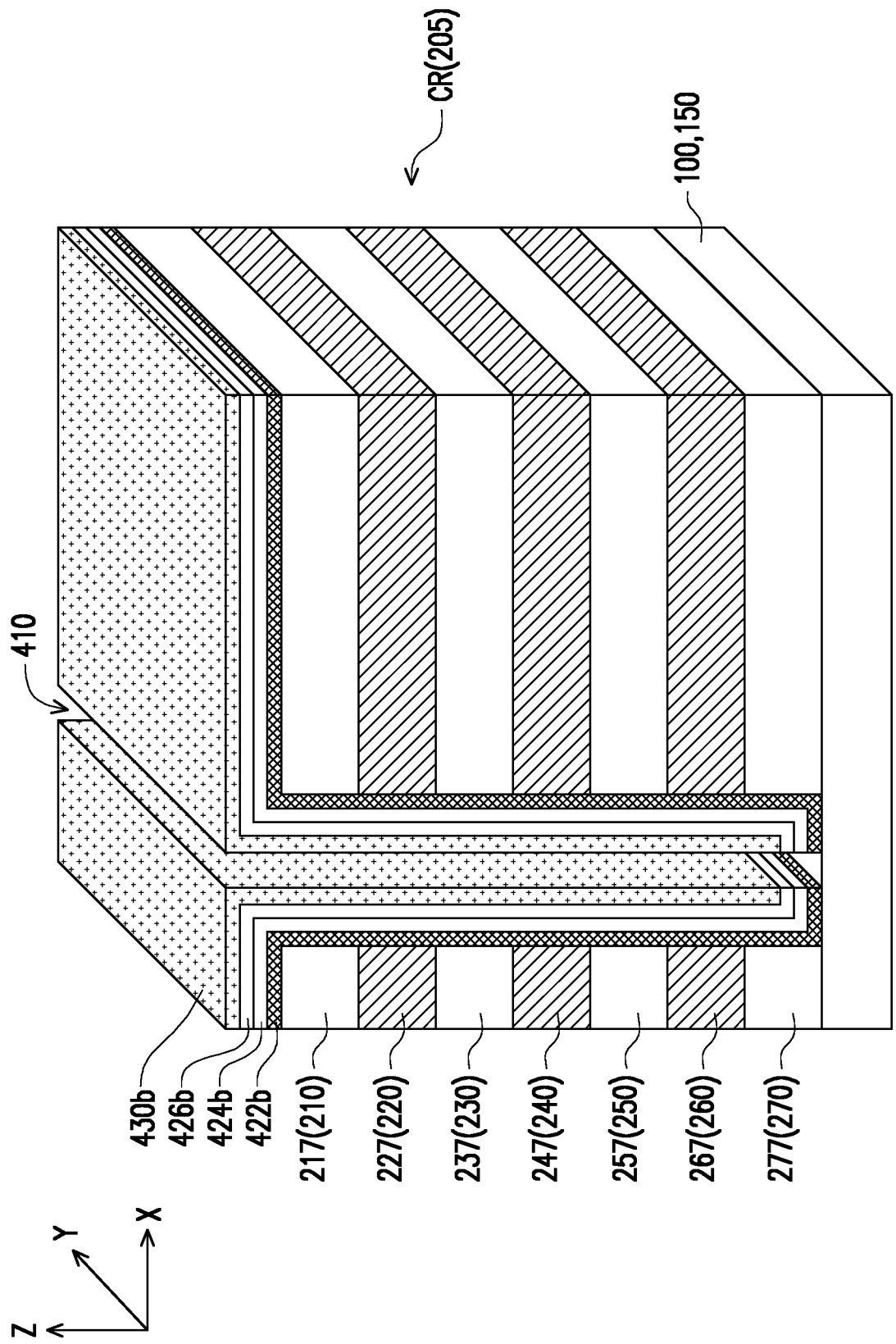

Referring to FIG. 13 and FIG. 14, portions of the isolation blanket layer 430a extending at the bottom of the trench 410 are removed, for example using a combination of photolithography and etching, thus forming the isolation blanket layer 430b. The etching may be any acceptable etch process, such as wet or dry etching, a reactive ion etch (RIE), neutral beam etch (NBE), the like, or a combination thereof. The etching may be anisotropic. The isolation blanket layer 430b remaining along the sidewalls of the trench 410 and on the multi-layered structure 205 may be used as an etch mask to sequentially etch through the cap blanket layer 426a, the channel blanket layer 424a, and the memory blanket layer 422a at the bottom of the trench 410. The etching may be any acceptable etch process, such as by wet or dry etching, a reactive ion etch (RIE), neutral beam etch (NBE), the like, or a combination thereof. The etching may be anisotropic. By doing so, portions of the layers 422b, 424b, 426b extending on opposite sidewalls of the trench 410 may be separated from each other, thus providing isolation for the cells of the memory array being formed.

Figure 15:
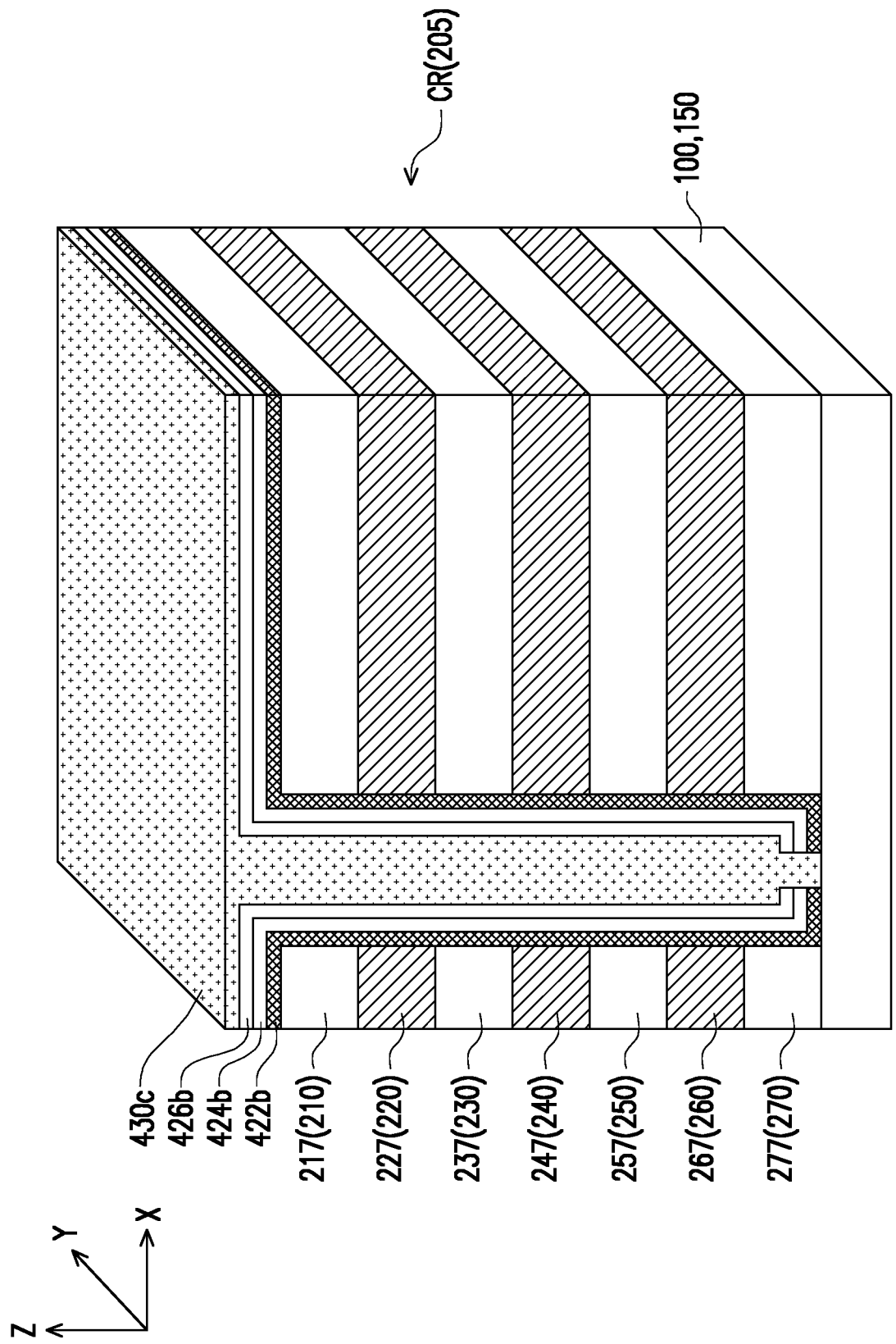

Referring to FIG. 14 and FIG. 15, additional dielectric material is deposited in the trench 410. In some embodiments, the material of the additional dielectric material may be selected from the same options previously discussed for the isolation blanket layer 430a. In some embodiments, the additional dielectric material may have the same composition of the isolation blanket layer 430b. In some embodiments, after the additional dielectric material is provided, the isolation blanket layer 430c may fill the trench 410.

Figure 16:
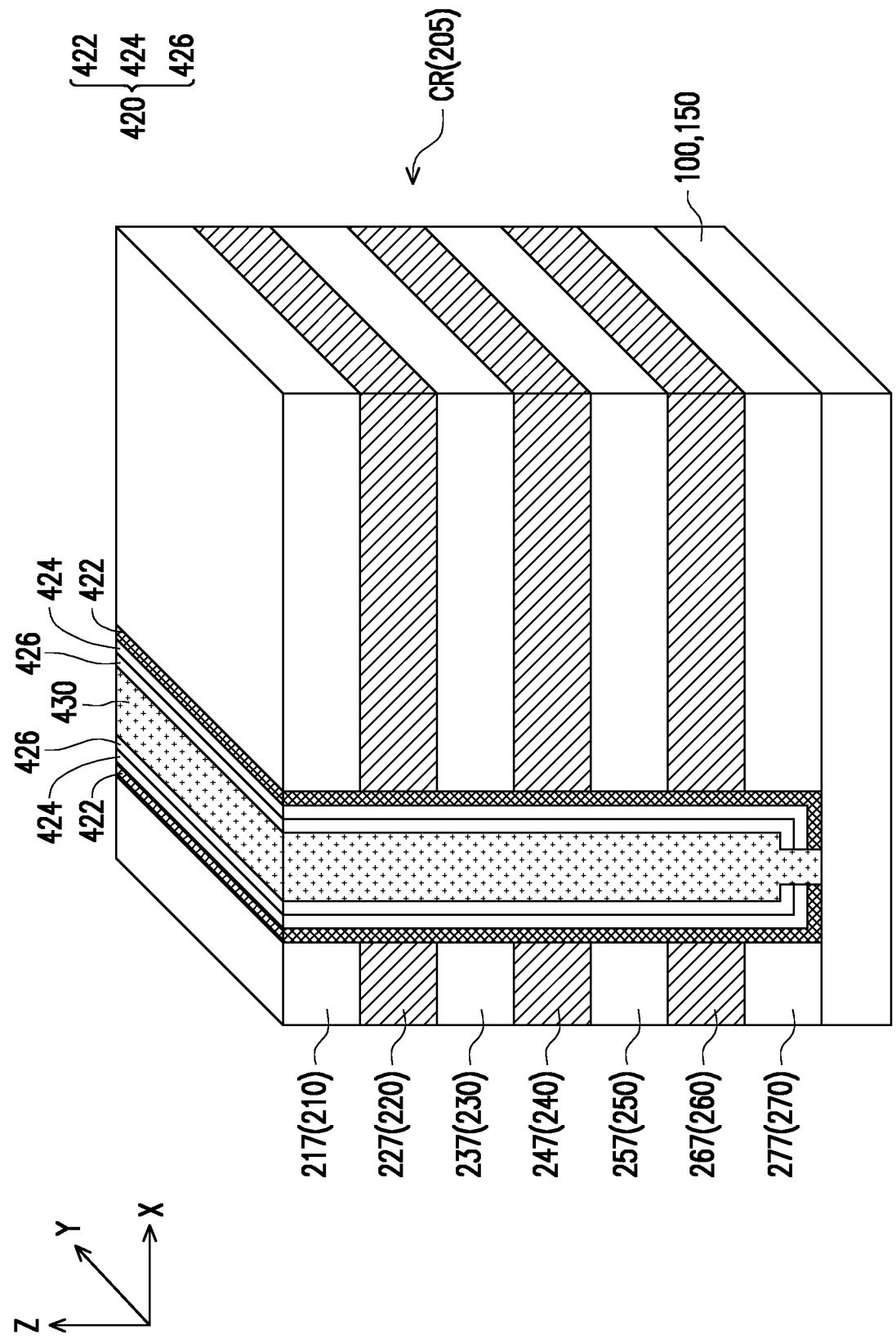

Referring to FIG. 15 and FIG. 16, portions of the isolation blanket layer 430c, the cap blanket layer 426b, the channel blanket layer 424b and the memory blanket layer 422b are removed until the dielectric layer 210 is exposed. For example, a planarization process such as chemical mechanical polish, an etch-back process, the like, or a combination thereof may be performed. Following the removal process, memory layers 422, channel layers 424, and cap layers 426 are disposed, in order, at opposite sidewalls of the isolation layer 430, in between the layers 210, 220, 230, 240, 250, 260, 270 of the multi-layered structure 205. In some embodiments, a memory layer 422, a channel layer 424, and a cap layer 426 formed on a same sidewall of a trench 410 may be collectively referred to as memory cell layers 420.

Figure 17:
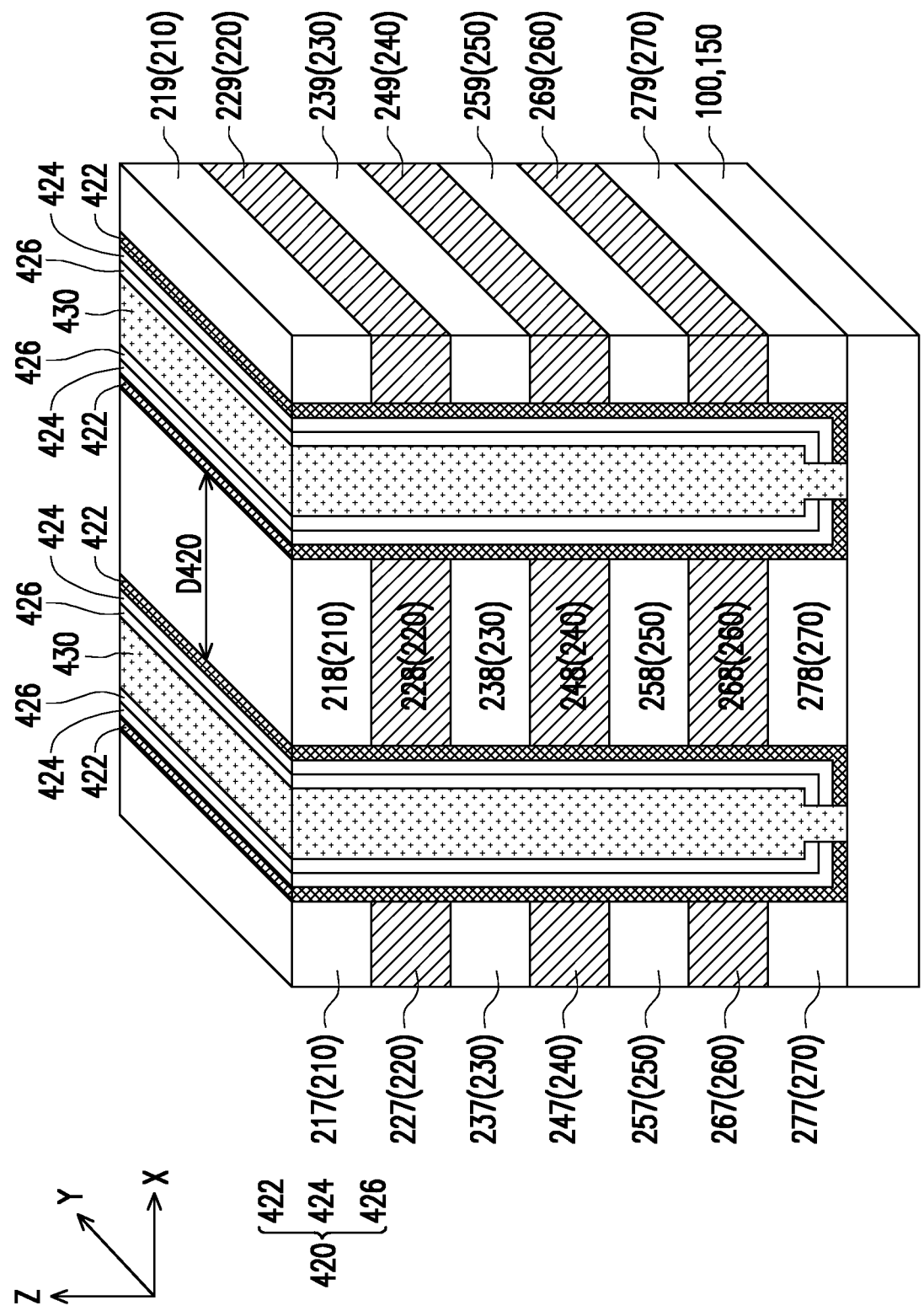

In FIG. 17, the steps described with reference to FIG. 12 to FIG. 16 may be repeated to form additional memory layers 422, channel layers 424, cap layers 426 and an isolation layer 430 in the multi-layered structure 205, for example at a level height along the X direction in between the position of the flights 284 and 286 of FIG. 10. In some embodiments, if multiple memory cells stacks are to be formed, the processes of FIG. 12 to FIG. 16 may be performed twice or more, so that the memory cell layers 420 formed on adjacent trenches (e.g., the trench 410 of FIG. 12) are formed during different process steps. For example, if four trenches are to be formed, the memory cell layers 420 of the first and the third trench may be formed together by performing a first time a sequence of processes such as described in FIG. 12 to FIG. 16, and afterwards the memory cell layers 420 of the second and the fourth trench may be formed by performing again the sequence of processes such as described in FIG. 12 to FIG. 16. In some embodiments, by forming the memory cell layers 420 of adjacent trenches 410 during different process steps, it is possible to reduce the distance D420 along the X direction between the memory cell layers 420 formed at closest sidewalls of adjacent trenches 410 (illustrated, e.g., in FIG. 12) with lower risk of collapse of the multi-layered structure 205 upon opening of the trenches 410.

In some embodiments, by repeating the process of FIG. 12 to FIG. 16, additional gate lines 228, 229, 248, 249, 268, 269 are formed from the conductive layers 220, 240, 260. The gate lines 228, 248, 268 are vertically stacked, and disposed further along the X direction with respect to the stacked gate lines 227, 247, 267. The gate lines 228, 248, 268 are alternately stacked along the Z direction with the isolation lines 238, 258, 278 and the gate lines 229, 249, 269 are alternately stacked along the Z direction with the isolation lines 239, 259, 279. In some embodiments, the gate lines 227, 247, 267 contact the memory cell layers 420 formed on one sidewall of the original trench 410 (illustrated, e.g., in FIG. 12), while the gate lines 228, 248, 268 contact the memory cell layers 420 formed on an opposite sidewall of the original trench 410. Furthermore, the gate lines 228, 248, 268 may contact at an opposite side along the X direction also the memory cell layers 420 formed on a sidewall of the additional trench, while the gate lines 229, 249, 269 contact the memory cell layers 420 formed on an opposite sidewall along the X direction of the additional trench. Similar to what was previously described for the gate lines 227, 247, 267, the gate lines 228, 248, 268 contact at opposite ends along the Y direction the flights 284 (illustrated, e.g., in FIG. 10), and the gate lines 229, 249, 269 contact at opposite ends along the Y direction the flights 286 (illustrated, e.g., in FIG. 10).

Figure 18:
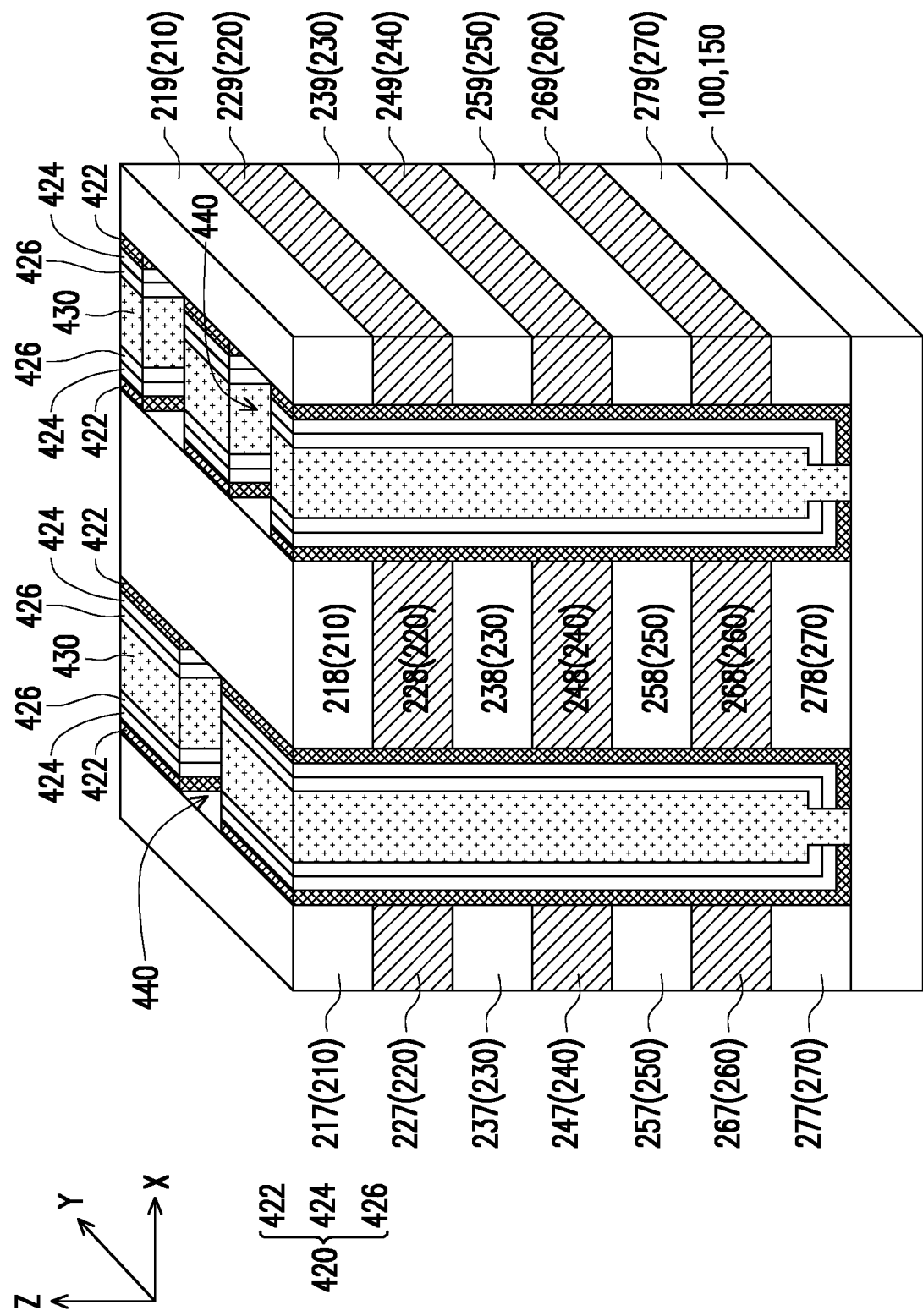

In FIG. 18, isolation trenches 440 are formed through the memory cell layers 420 and the isolation layer 430 by removing portions of the memory layer 422, the channel layer 424, the cap layer 426 and the isolation layer 430. In some embodiments, the isolation trenches 440 extend along the X direction so as to separate the memory cell layers 420 formed at the same sidewall of a trench 410 (illustrated, e.g., in FIG. 12) in multiple portions belonging to different stacks of memory cells. The isolation trenches 440 may be formed through a combination of photolithography and etching, for example.

Figure 19:
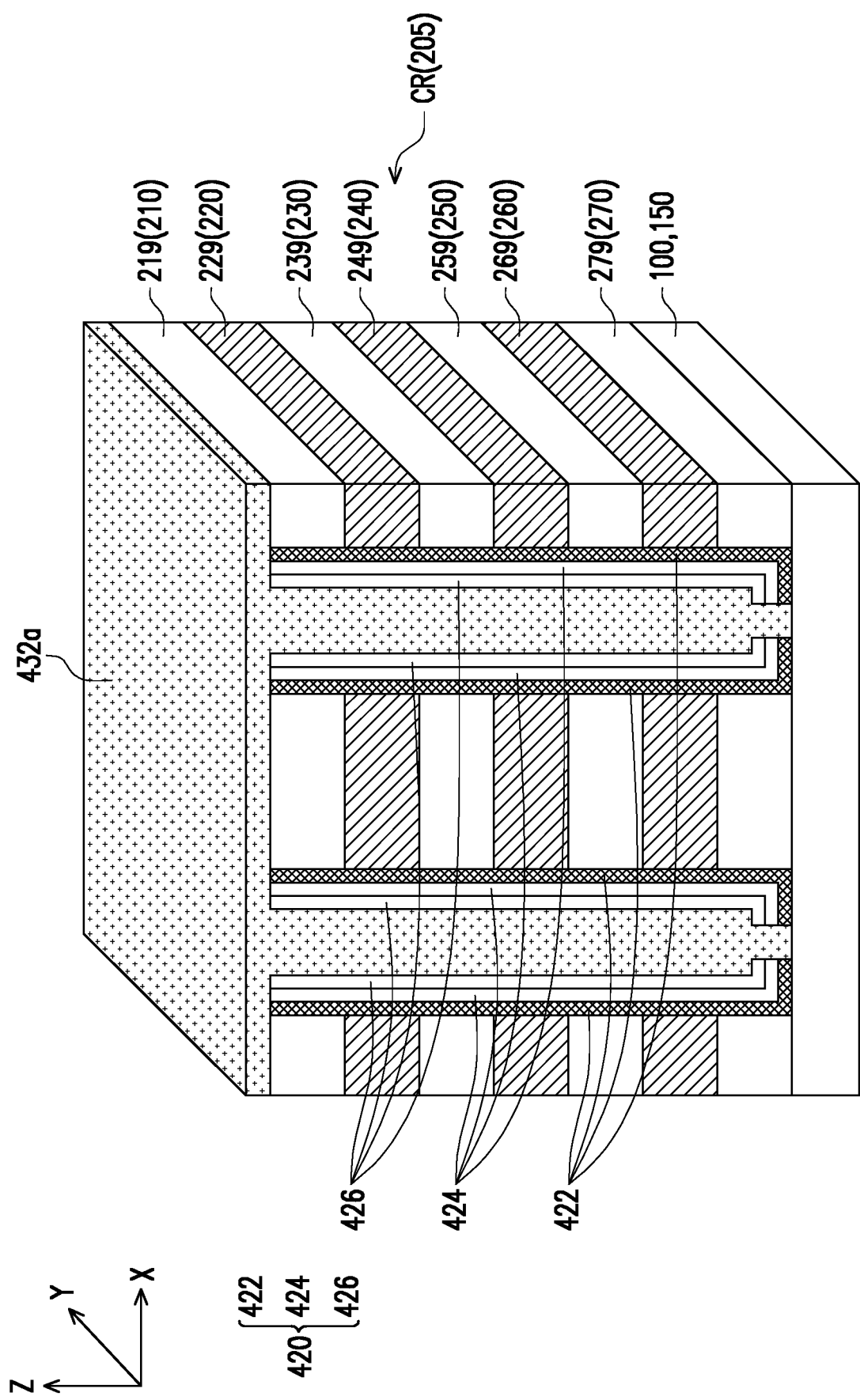
Figure 20:
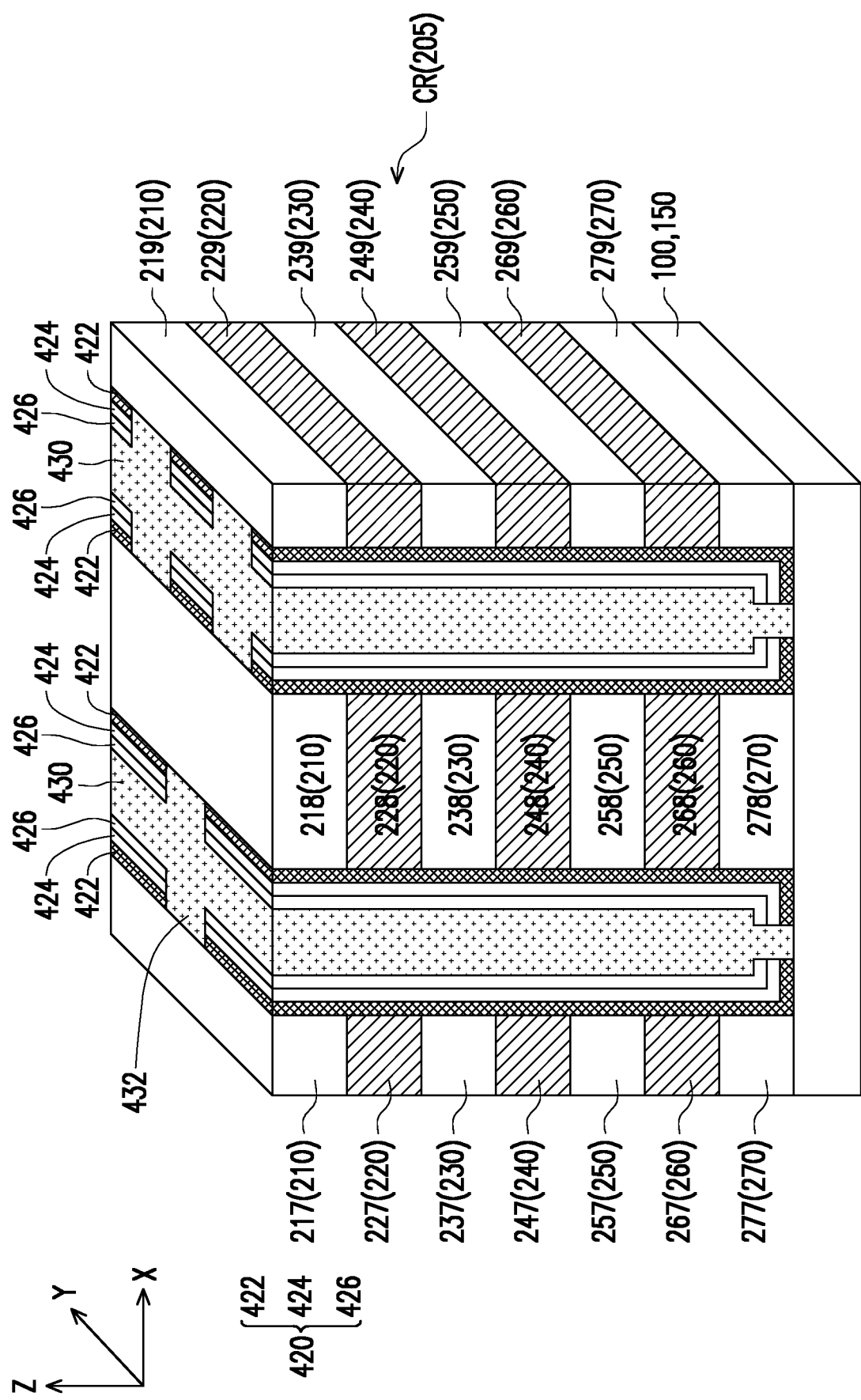

Referring to FIG. 18 and FIG. 19, a dielectric material 432a is deposited in and fills the isolation trenches 440. The dielectric material 432a may include, for example, silicon oxide, silicon nitride, silicon oxynitride, or the like, which may be deposited by CVD, PVD, ALD, PECVD, or the like. The dielectric material 432a may be formed so as to initially extend over the top surface of the dielectric layer 210, covering the memory cell layers 420. After deposition, a planarization process (e.g., a CMP, etch back, or the like) may be performed to remove excess portions of the dielectric material 432a. In the resulting structure, isolation plugs 432 remain in places of the isolation trenches 440, as illustrated, e.g., in FIG. 20. Top surfaces of the dielectric layer 210, the isolation plugs 432, the memory cell layers 420, and the isolation layer 430 may be substantially level (e.g., within process variations) along the Z direction. In some embodiments, the material of the isolation plugs 432 includes a same material as the isolation layer 430. However, the disclosure is not limited thereto, and, in some alternative embodiments, the isolation plugs 432 may include a different material than the isolation layers 430. In some embodiments, materials of the isolation plugs 432 and the isolation layers 430 may be selected so that they may be etched selectively relative to each other. For example, in some embodiments, the isolation layers 430 include an oxide and the isolation plugs 432 include a nitride. In some alternative embodiments, the isolation layers 430 include a nitride and the isolation plugs 432 include an oxide. Other materials are also possible. In some embodiments, the isolation layers 430 and the isolation plugs 432 may isolate from each other stacks of memory cells in which the memory cells are vertically disposed one on top of each other.

Figure 21:
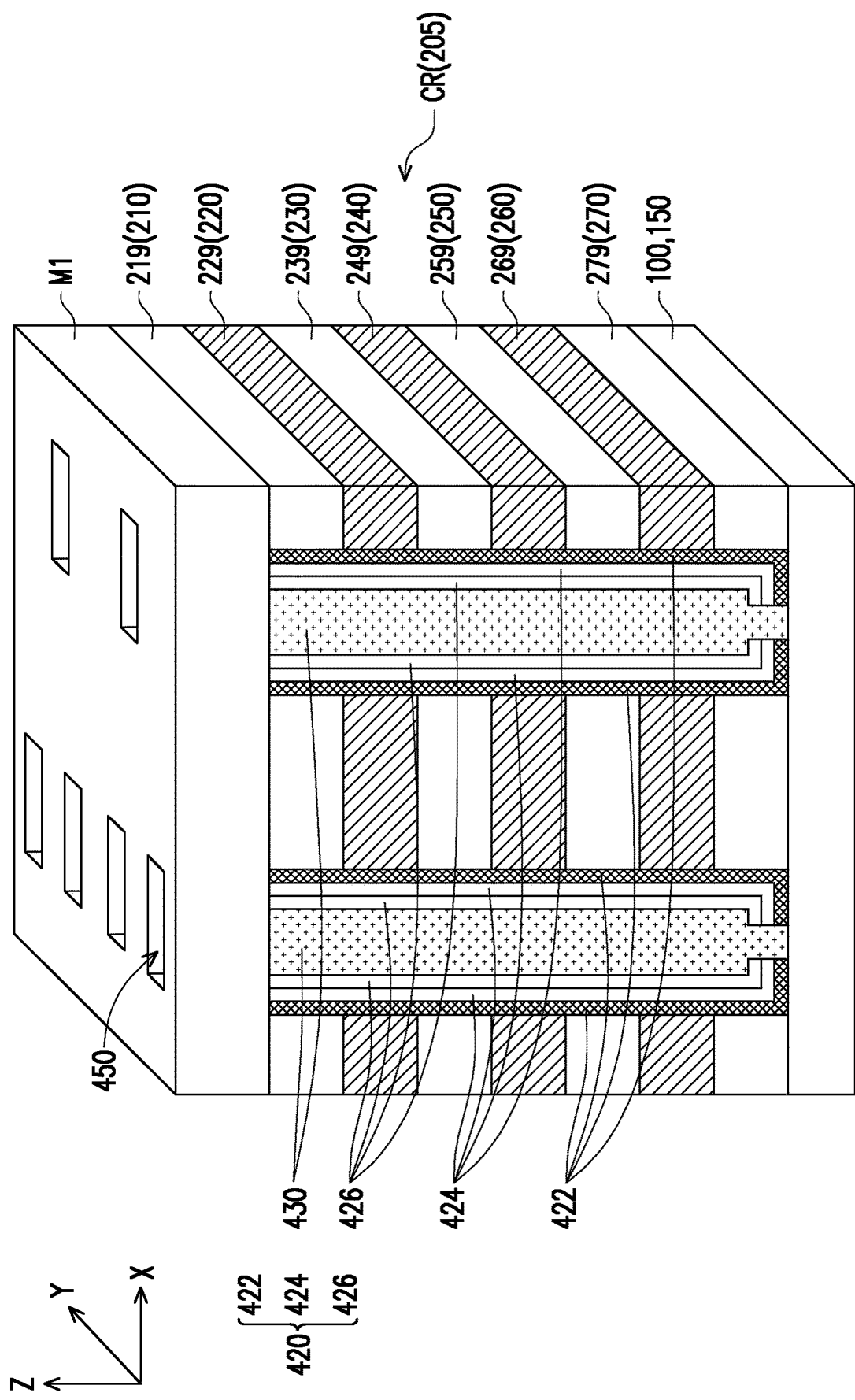

In FIG. 21, a patterned mask M1 is provided on the upper dielectric layer 210. The patterned mask M1 includes openings which are used to define the position of source and drain trenches 450 at opposite sides of the isolation plugs 432 (illustrated, e.g., in FIG. 20) along the Y direction. In some embodiments, the source and drain trenches 450 are formed by removing portions of the isolation layer 430 and the cap layer 426 for the entire thickness along the Z direction of the multi-layered structure 205. In some embodiments, portions of the channel layer 424 are also removed to form the source and drain trenches 450, so that the memory layer 422 is exposed at the facing sidewalls of the source and drain trenches 450 along the X direction (e.g., the sidewalls extending in YZ planes). That is, the source and drain trenches 450 may extend from the memory layer 422 of a stack of memory cells to the memory layer 422 of an opposite stack of memory cells along the X direction formed within a same trench 410 (illustrated, e.g., in FIG. 12). In some alternative embodiments, the channel layers 424 may be left in place, and the source and drain trenches 450 may extend between opposite pairs of channel layers 424.

Figure 22:
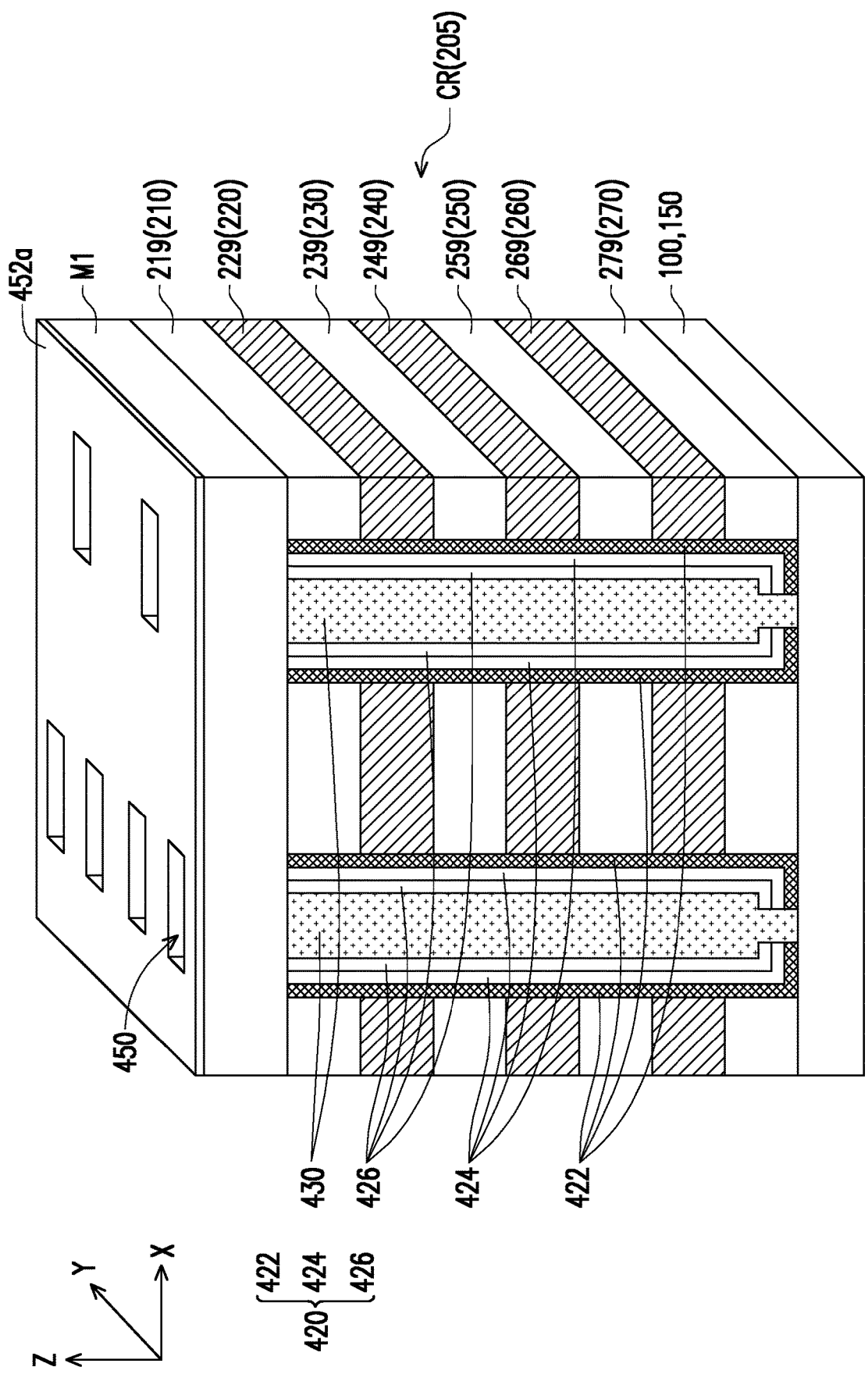
Figure 23:
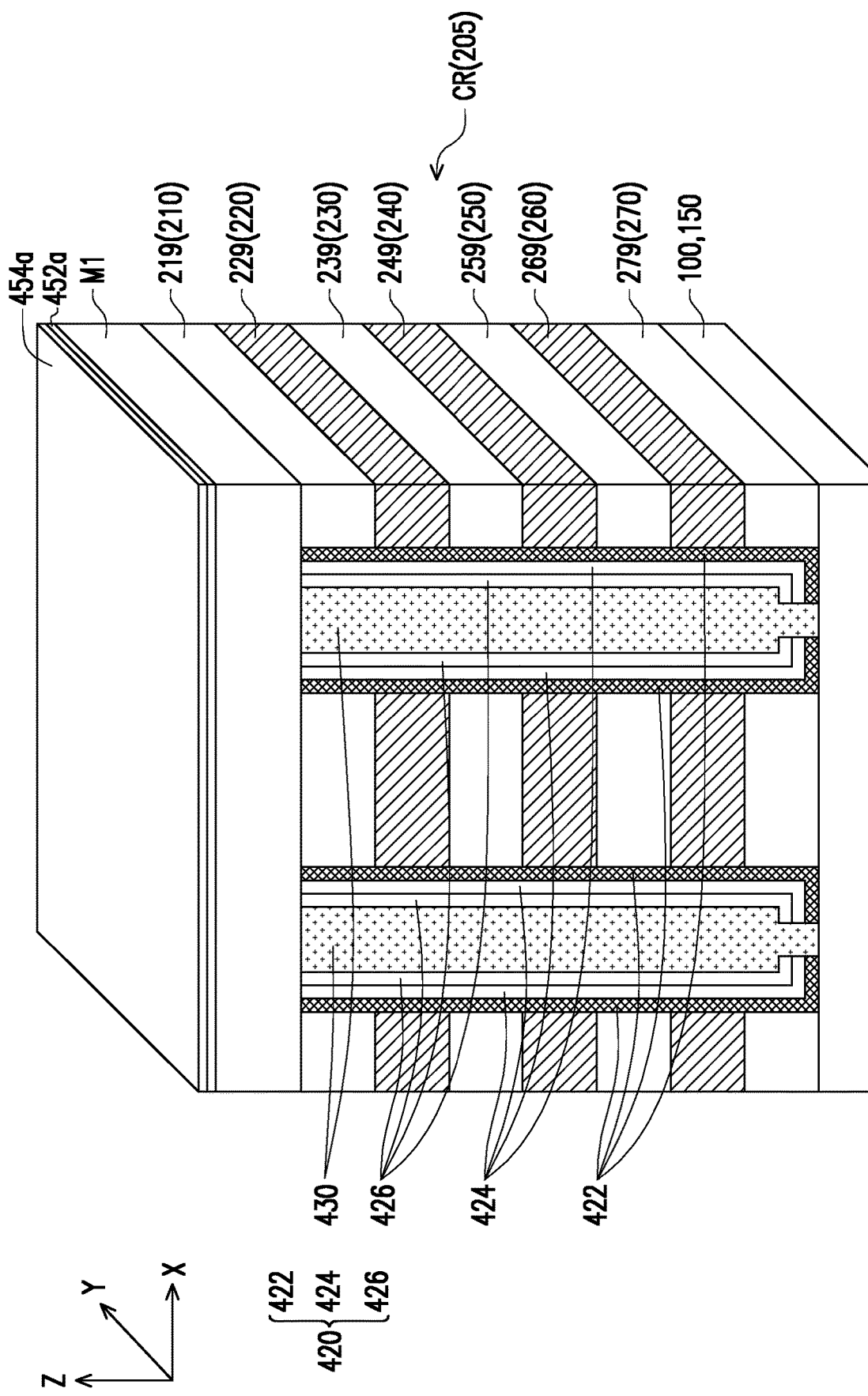

In FIG. 22, a liner blanket layer 452a is formed on the patterned mask M1, lining the sidewalls of the source and drain trenches 450. In some embodiments, the liner blanket layer 452a is formed along the sidewalls of the source and drain trenches 450, and may further cover the bottom of the source and drain trenches 450. In some embodiments, the liner blanket layer 452a may include a conductive material, such as titanium nitride. The liner blanket layer 452a may be formed through, for example, a sputtering process, a physical vapor deposition (PVD) process, or the like. Referring to FIG. 22 and FIG. 23, a conductive material 454a is formed on the liner blanket layer 452a to fill the source and drain trenches 450. In some embodiments, the conductive material 454a may initially cover the multi-layered structure 205. In some embodiments, the conductive material 454a may be formed by a suitable deposition process, a plating process, or the like. The plating process is, for example, electro-plating, electroless-plating, immersion plating, or the like. In some embodiments, the liner blanket layer 452 may act as seed layer during formation of the conductive material 454a. A removal process such as chemical-mechanical polish, back-etch, or a combination thereof may be performed to remove portions of the conductive material 454a and the liner blanket layer 452a, as well as the patterned mask M1 until the top surface of the dielectric layer 210 is once again exposed.

Figure 24:
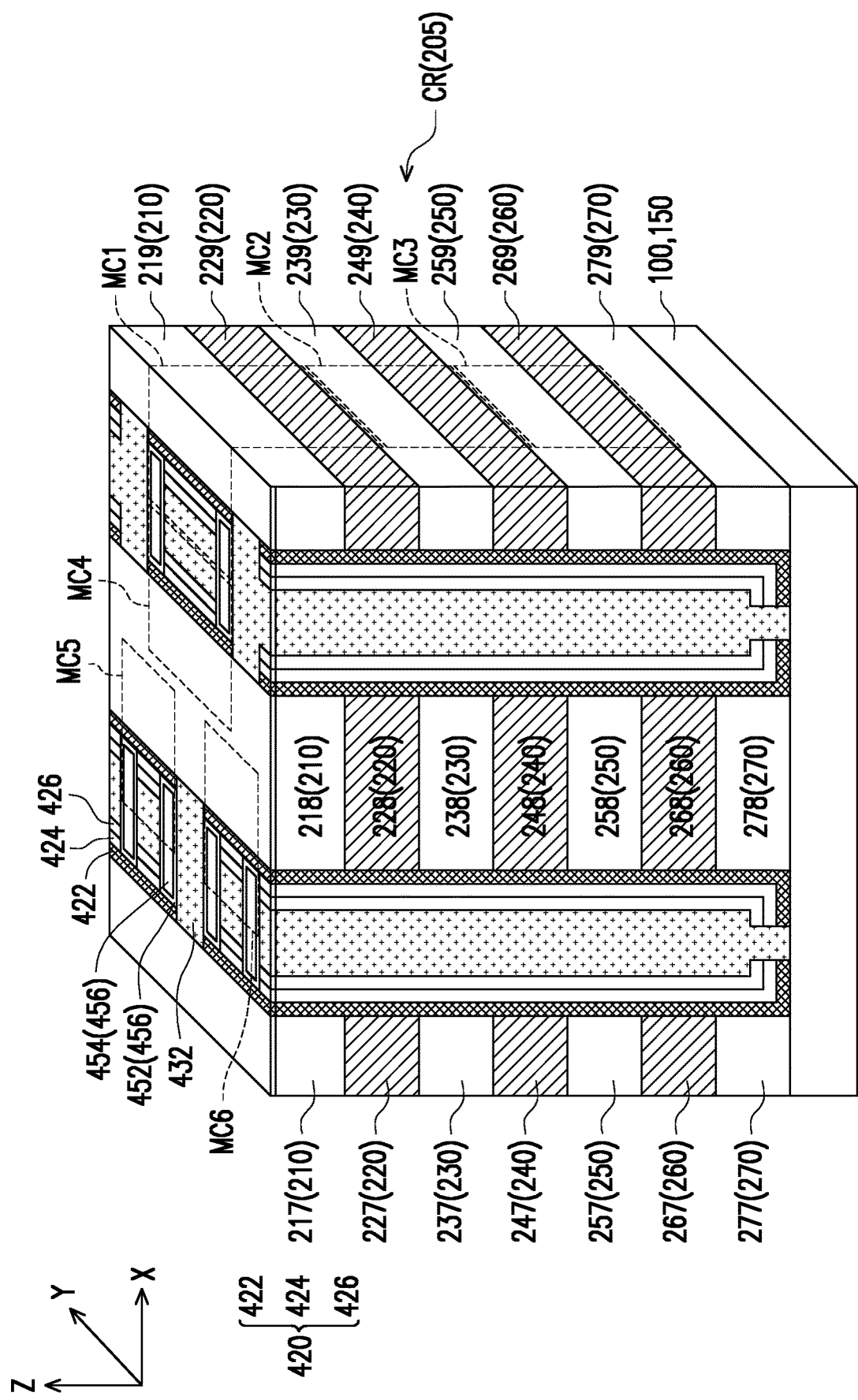

Following the removal process, source and drain plugs 454 surrounded by liner layers 452 remain in the source and drain trenches 450, as illustrated, e.g., in FIG. 24. The source and drain plugs 454 with the corresponding liner layers 452 may be collectively referred as source and drain lines 456. In some embodiments, the source and drain plugs 454 may include a metallic material, such as aluminum, titanium, copper, nickel, tungsten, and/or alloys thereof. In some embodiments, the liner layers 452 may act as diffusion barrier layer for the material of the source and drain plugs 454. In some embodiments, the liner layers 452 may improve adhesion of the source and drain plugs 454 with the surrounding elements. In some embodiments, the source and drain plugs 454 may complete transistors of the memory cells (e.g., MC1-MC3) of the cell region CR. The memory cells MC1-MC3 disposed on a same side of a stack of gate lines 229, 249, 269 are vertically stacked on each other along the Z direction to form memory cell stacks. Within a memory cell stack, the memory cells MC1-MC3 may share the same source and drain lines, while being contacted by different gate lines 229, 249, 269. For example, the memory cell MC1 includes the gate line 229, while the underlying memory cell MC2 includes the gate line 249 and the memory cell MC3 includes the gate line 269. Therefore, the memory cells MC1-MC3 may be selectively addressed with respect to each other by applying a desired voltage to the corresponding gate line 229, 249, or 269. In some embodiments, some gate lines may be shared between memory cells. For example, the gate lines 228 is shared between the memory cells MC4, MC5 and MC6. The memory cells MC4, MC5, and MC6 may be selectively addressed by applying voltages to the corresponding source and drain lines 456, while a voltage is applied to the shared gate line 228. The memory cells underlying the memory cells MC4, MC5, and MC6 may be selectively addressed by applying voltage to the individual gate lines 228, 248, 268. In other words, the multi-layered structure 205 may be a tridimensional memory array.

Figure 25:
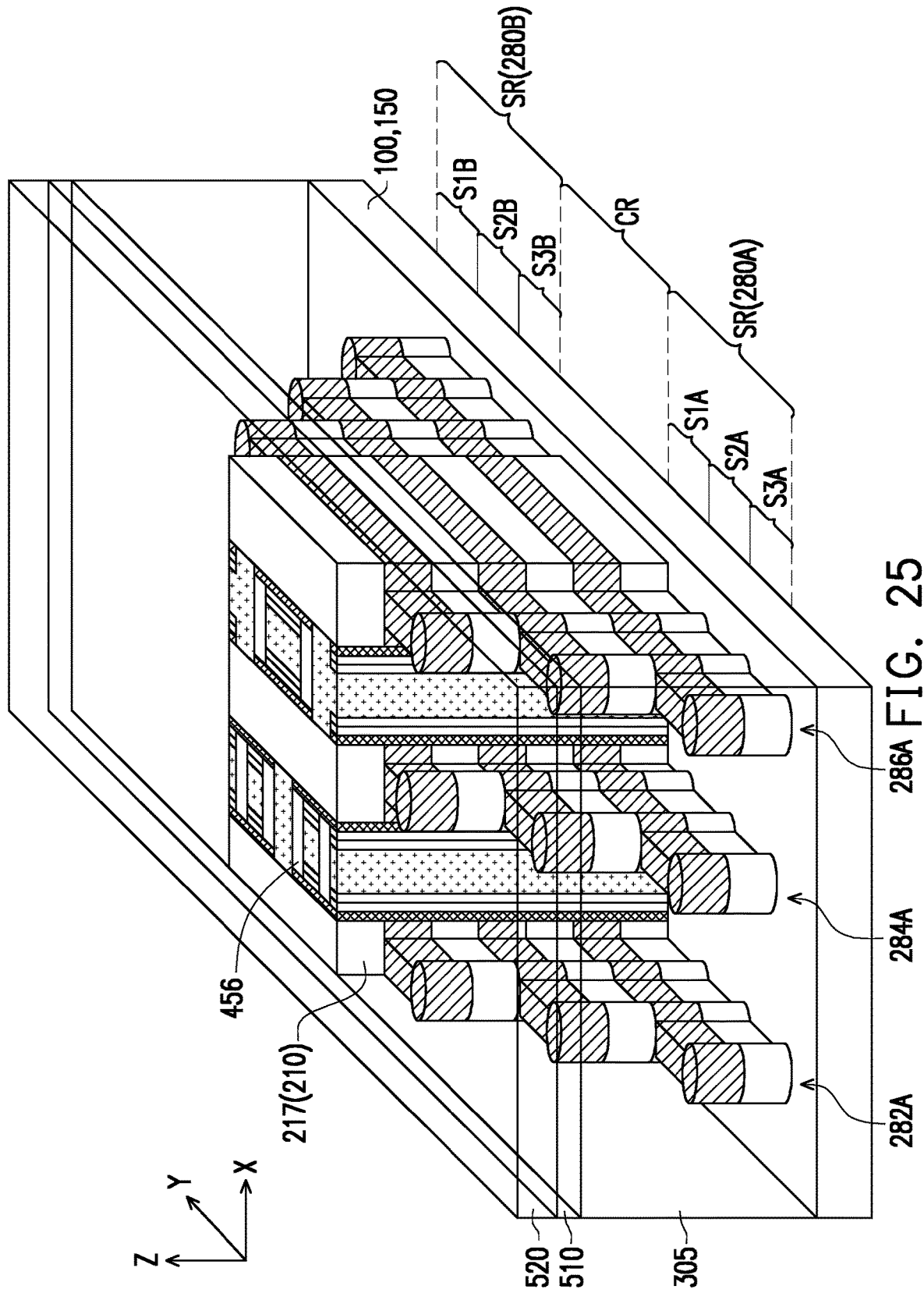

In FIG. 25, an etch stop layer 510 and an ILD 520 are sequentially formed on the multi-layered structure 205 and the ILD 355, covering the top surface of the dielectric layer 210. In some embodiments, the etch stop layer 510 may include a dielectric material such as silicon nitride. In some embodiments, the etch stop layer 510 may also act as a passivation layer, to prevent contaminants (e.g., steam, hydrogen or the like) to diffuse into the cell area. In some embodiments, the etch stop layer 510 and the ILD 520 include different materials, for example materials that may be selectively etched with respect to each other and with respect to the ILD 355.

Figure 26:
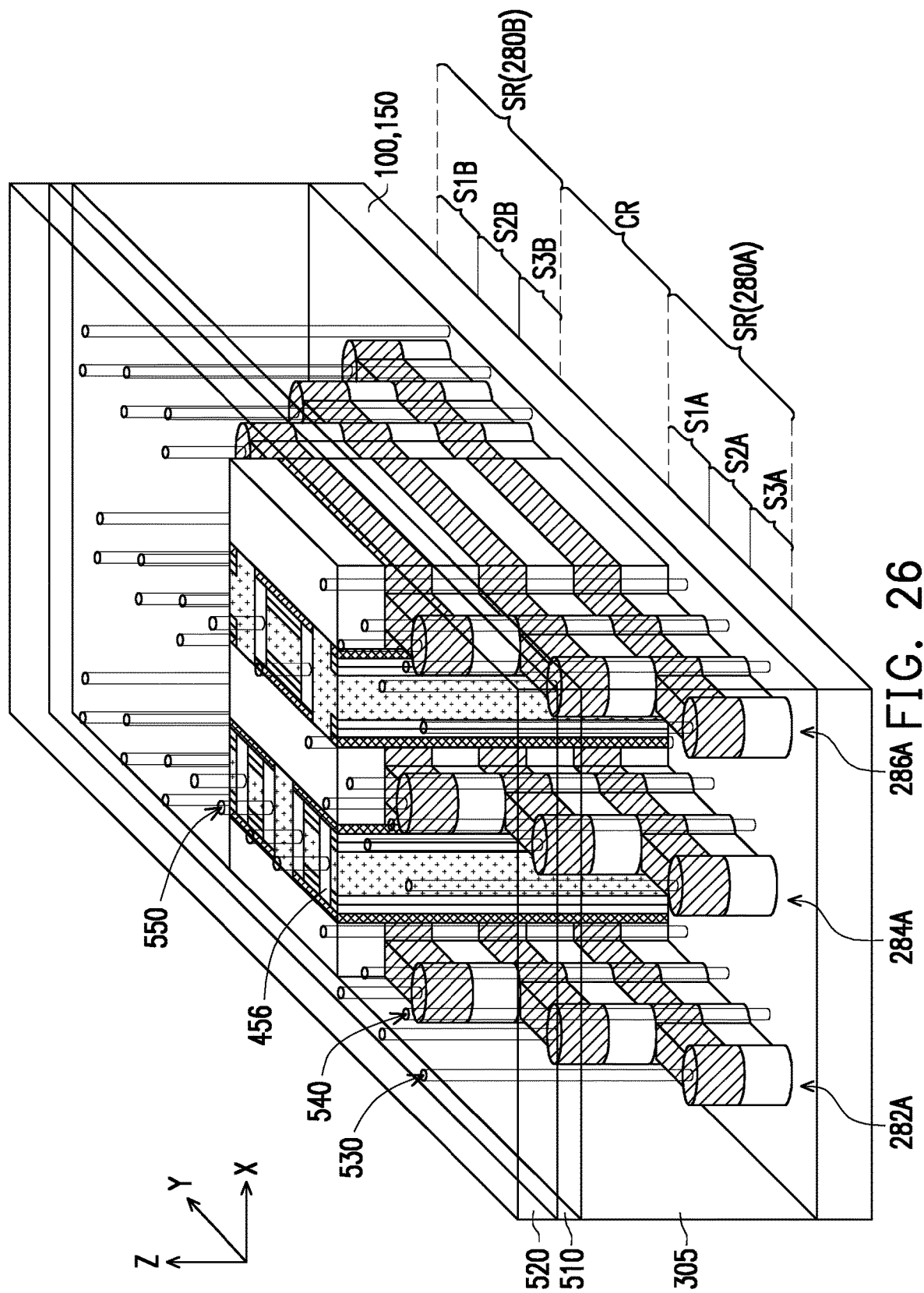

In FIG. 26, via holes 530, 540, 550 are formed through the ILDs 510, 520, and 305, for example via one or more acceptable etching processes, such as wet or dry etching, reactive ion etch (RIE), neutral beam etch (NBE), the like, or a combination thereof. The etching may be anisotropic. One or more auxiliary masks (not shown) may be used to define the positions of the via holes 530, 540, 550. In some embodiments, the via holes 530 extend through the ILDs 510, 520, 305 in the staircase regions SR to expose at their bottom portions of the top surfaces of the topmost landing pads of the steps S1-S3. For example, the via hole 530 formed on the flight 282A in correspondence of the step S1A exposes at its bottom a portion of the top surface of the landing pad 262A, and so on. Via holes 530 landing on different steps S1-S3 may have different lengths along the Z direction. For example, the via holes 530 landing on the steps S1 are longer than the via holes 530 landing on the steps S2, and the via holes 530 landing on the steps S2 are longer than the via holes 530 landing on the steps S3. The via holes 540 are formed beside the via holes 530 in the steps regions SR, extending across the ILDs 510, 520, and 305 to reach the interconnection tier 150 or, more generally, to expose at their bottom conductive patterns electrically connected to the driving circuitry of the memory cells of the memory array. The driving circuitry (e.g., driving transistors) may be formed on the semiconductor substrate 100 (such as the transistors 110, 120 of FIG. 1), or may be formed in one of interconnection tiers of the interconnection structure IN (illustrated, e.g., in FIG. 1). That is, the driving circuitry may include front-end-of-line transistors, back-end-of-line transistors, or a combination thereof. In some embodiments, there is one via hole 540 for each via hole 530. The via holes 540 may be the longest among the via holes 530, 540, 550. The via holes 550 are formed in the cell region CR, extending across the ILDs 510, 520, and expose at their bottom portions of the top surfaces of the source and drain lines 456. In some embodiments, the via holes 550 are shorter than both the via holes 530 and the via holes 540.

Figure 27:
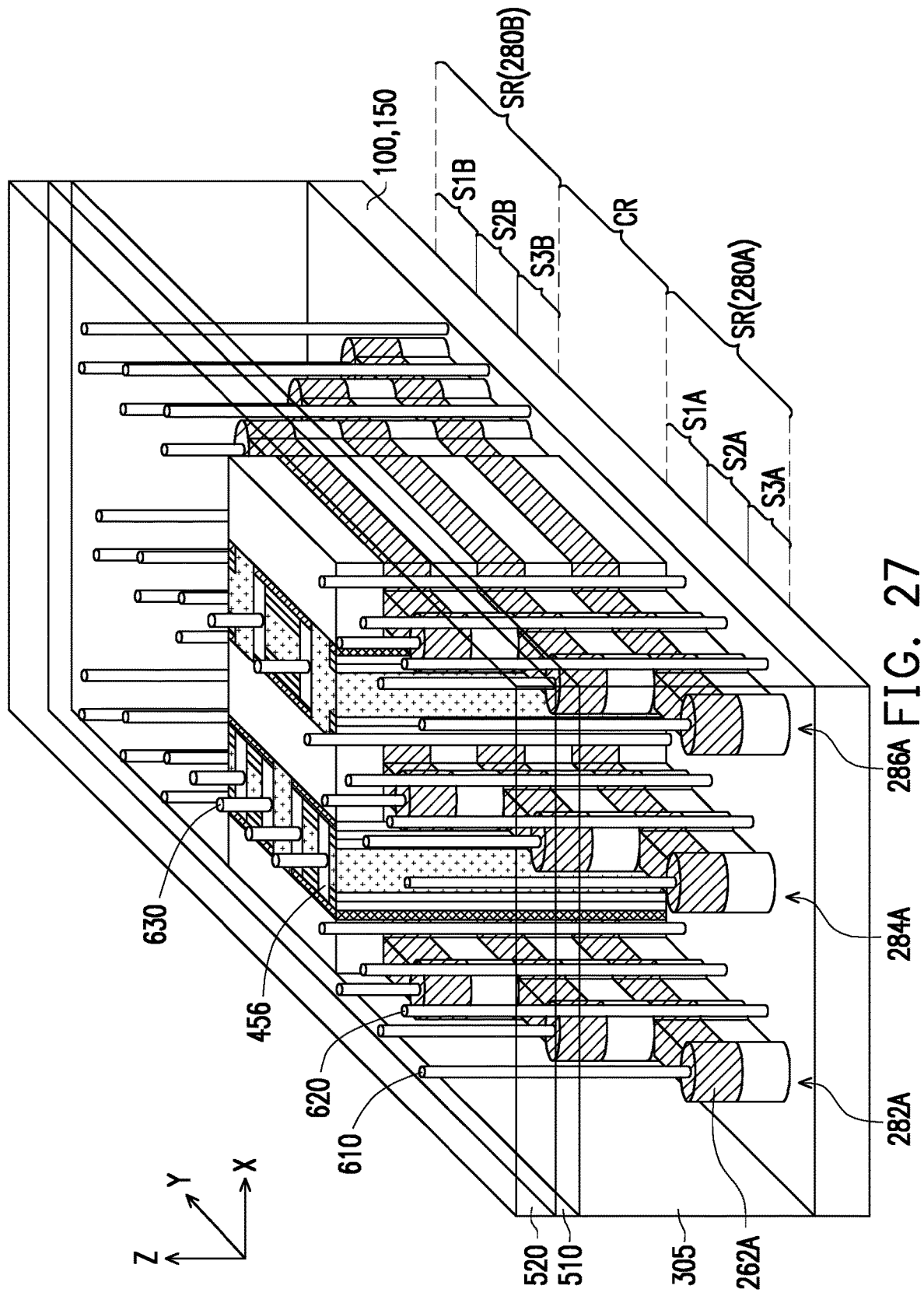

Referring to FIG. 26 and FIG. 27, the via holes 530, 540, 550 are filled with conductive material, to form the contact vias 610, 620 and 630, respectively. In some embodiments, the conductive material includes a metallic material, such as aluminum, titanium, copper, nickel, tungsten, and/or alloys thereof. In some embodiments, the contact vias 610, 620, 630 may be formed by overfilling the via holes 530, 540, 550 and then removing excess conductive material, for example via chemical mechanical polish, etch back, or the like.

Figure 28:
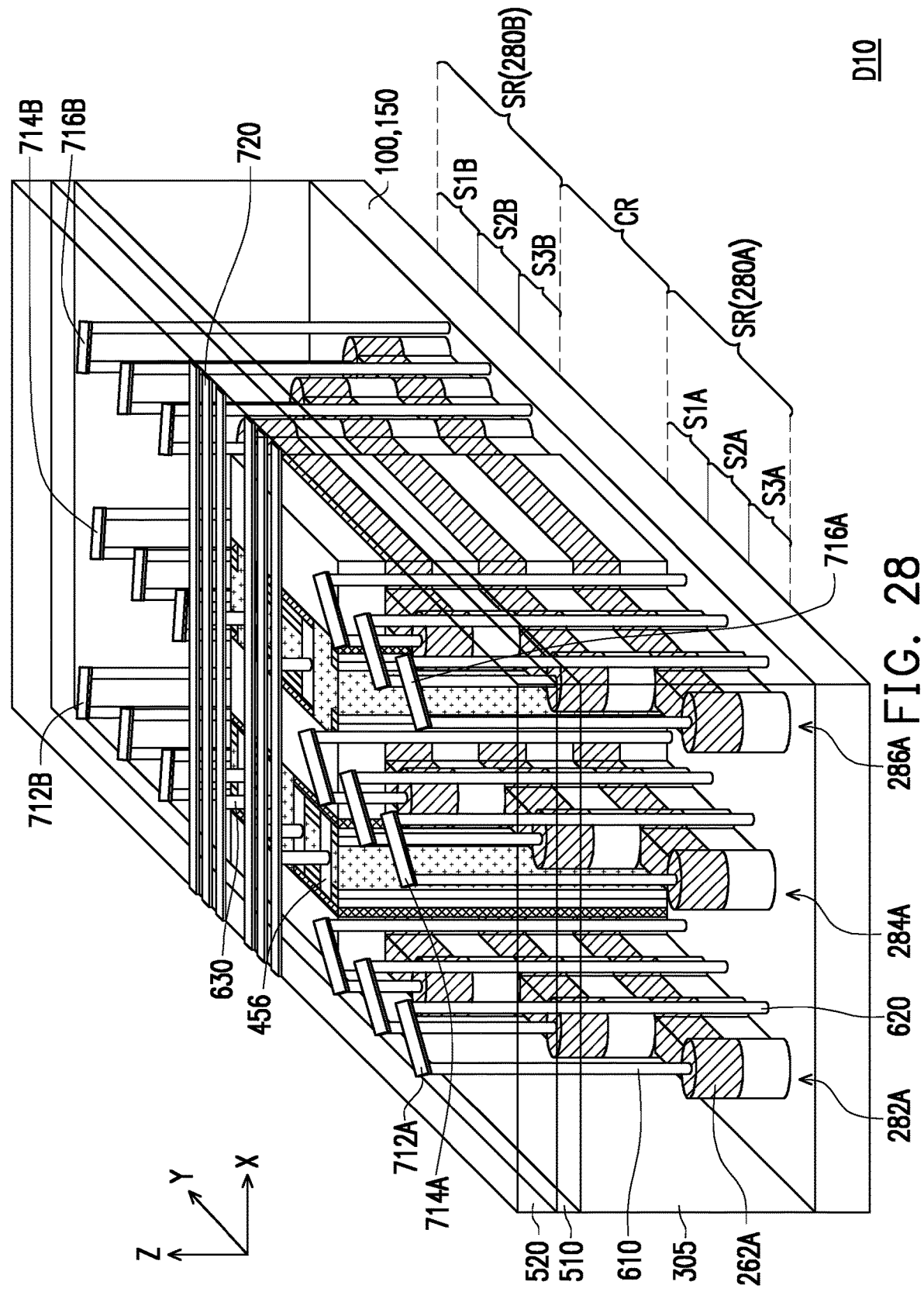
Figure 30A:
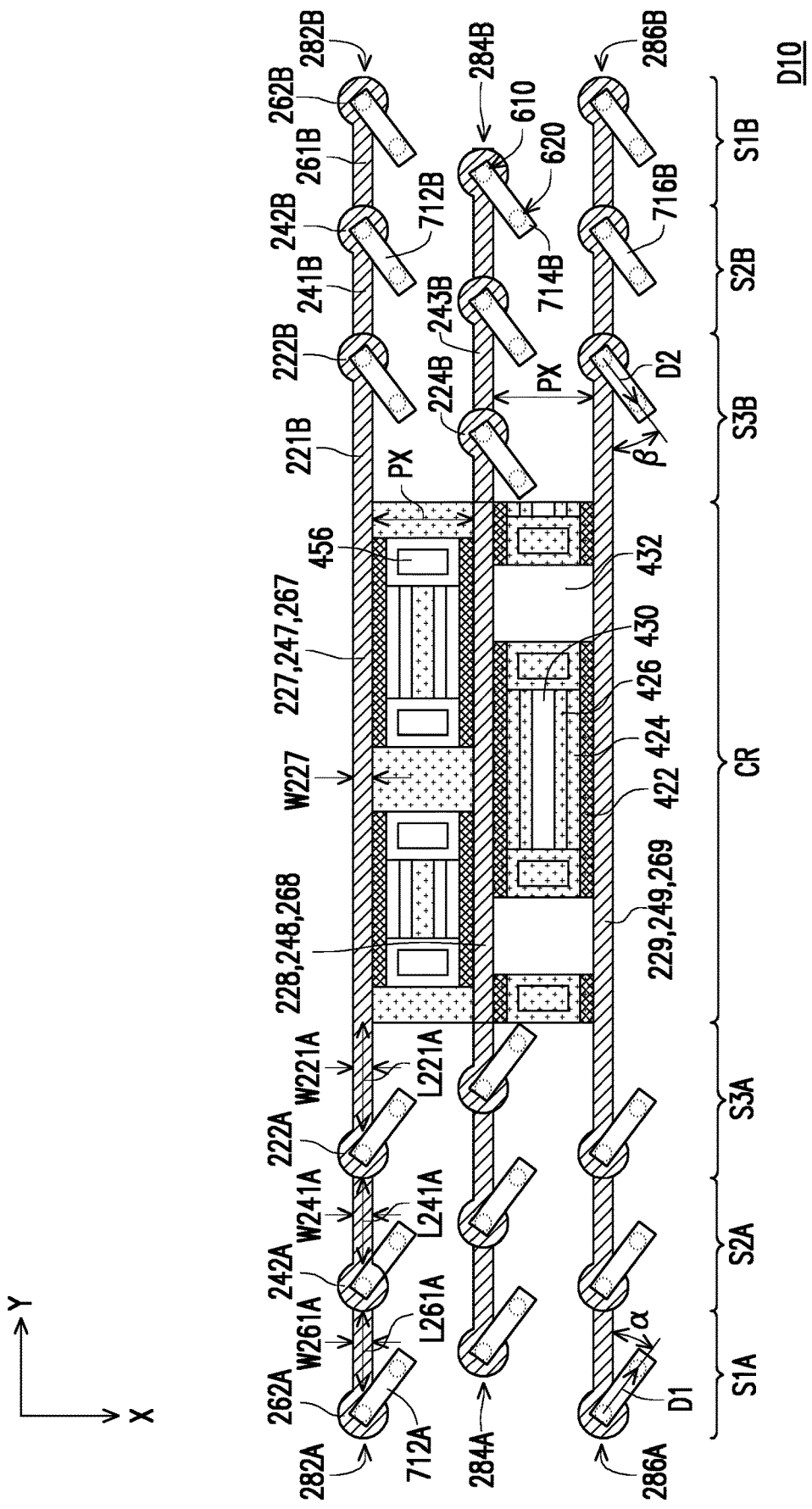
FIG. 30A to FIG. 30G are schematic top views of semiconductor devices according to some embodiments of the disclosure.

FIG. 30A is a schematic top view of the structure of FIG. 28 according to some embodiments of the disclosure. Several elements have been omitted in the view of FIG. 30A for the purpose of clarity and simplicity. Referring to FIG. 28 and FIG. 30A, bridge patterns 712, 714, 716 and bit and signal lines 720 are formed on the ILD 520, to electrically contact the contact vias 610, 620, 630. More specifically, the bridge patterns 712, 714, 716 are respectively formed in correspondence of the flights 282, 284, 286 to establish electrical contact between the contact vias 610 landing on the staircases 280 and the corresponding contact vias 620 connected to the driving transistors. For example, three bridge patterns 712A are formed in correspondence of the flight 282A, one bridge pattern 712A for each step S1A-S3A of the flight 282A. Taking as an example the step S1A, one end of the bridge pattern 712A is disposed on the contact via 610 landing on the landing pad 262A, and the other end of the same bridge pattern 712A is disposed on the adjacent contact via 620. Therefore, the bridge pattern 712A establishes electrical contact between the landing pad 262A (and, hence, the gate line 267) and the assigned driving transistor. In some embodiments, contact vias 610 may be formed on both staircases 280 formed at opposite ends of the cell region CR. The bit and signal lines 720, on the other hand, contact the contact vias 630, to establish electrical contact with the source and drain lines 456.

In some embodiments, gate lines vertically stacked such as the gate lines 227, 247, 267 are connected at opposite ends to a pair of flights 282A, 282B. In some embodiments, the steps S1-S3 of the flights 282 are formed by connective lines 221, 241, 261 joined to corresponding landing pads 222, 242, 262, where the connective lines 221, 241, 261 and the landing pads 222, 242, 262 were formed from same conductive layers 220, 240, 260 as the gate lines 227, 247, 267. In some embodiments, vertically stacked elements may have the same width along the X direction. In some embodiments, the landing pads (e.g., the landing pads 222) are wider along the X direction than the associated connective lines (e.g., the connective lines 221) and gate lines (e.g., the gate line 227). That is, the width W222A of the landing pads 222 may be larger than both the width W221A of the connective line 221A and the width W227 of the gate line 227. In some embodiments, the gate line 227 (e.g., the topmost gate line of the stack of gate lines 227, 247, 267) is joined to one connective line 221 and one landing pad 222 per side, while the lower gate lines (e.g., the middle gate line 247) are joined by more pairs (e.g., two) of alternating connective lines (e.g., 241) and landing pads (e.g., 242) per side. In some embodiments, the width W221, W241, or W261 of the connective lines 221, 241, 261 may be substantially equal to the width W227, W247, W267 of the gate lines 227, 247, 267.

In some embodiments, the gate lines of a stack (e.g., the vertically stacked gate lines 227, 247, 267) and the corresponding flights (e.g., 282A and 282B) may be considered to extend along the Y direction, substantially parallel to adjacent stacks of gate lines (e.g., the stack including the gate lines 228, 248, 268 and the stack including the gate lines 229, 249, 269) and corresponding flights (e.g., 284A, 284B and 286A, 286B). The stacks of gate lines and the corresponding flights may be distributed along the X direction, for example at a pitch PX in the range from 1 nm to 1000 nm. In some embodiments, the pitch PX may be selected as a function of the widths (e.g., W222, W224, W226) of the landing pads (e.g., 222, 224, 226). For example, the ratio of the width of a landing pad (e.g., W222A) to the pitch PX separating the gate line associated with the landing pad (e.g., the gate line 227 for the landing pad 222A) from the gate lines of an adjacent stack (e.g., the gate lines 228, 248, 268) may be in the range from 1 to 1000. The pitch PX is measured in correspondence of the connective lines (e.g, 221, 241) or the gate lines (e.g., 227, 228) rather than the landing pads (e.g., 222). In some embodiments, the landing pads (e.g., 222, 224) of adjacent flights (e.g., 282, 284) are formed in a staggered configuration along the Y direction, so that the landing pad (e.g., 222B) of a flight (e.g., 282B) faces along the X direction the connective line (e.g., 243B) of the adjacent flight (e.g., 284B). By doing so, the pitch PX between adjacent flights (2.g., 282B, 284B) may be reduced, thus reducing the overall footprint of the array of memory cells.

In some embodiments, the bridge patterns 712, 714, 716 are tilted with respect to the extension direction of the corresponding flights 282, 284, 286 (e.g., the Y direction). Taking as an example the flight 286A, the tilting angle α between the extension direction of the flight 286A (e.g. the Y direction) and the extension direction D1 of the associated bridge patterns 716A may be in the range from 0 degrees to 90 degrees. In some embodiments, the extension direction (e.g., D1) of a bridge pattern (e.g., 716A) is considered the direction joining the center of the contact area of the contact via 610 and the bridge pattern to the center of the contact area of the contact via 620 and the bridge pattern. In some embodiments, the extension directions (e.g., D1, D2) of the bridge patterns 712, 714, 716 may independently vary. As illustrated in FIG. 30A, in some embodiments bridge patterns (e.g., 716A and 716B) located at opposite sides of the cell region CR may have convergent extension directions (D1 and D2). In some embodiments, the tilting angles (e.g., a and 3 in FIG. 30A) of the bridge patterns are measured with respect to the extension direction of the flights (e.g., 286A and 286B) taken to point towards the cell region CR. So, for example, the angle α pertaining to bridge pattern 716A of the flight 286A is measured between the extension direction D1 and the positive Y direction, while the angle α pertaining to the bridge pattern 716B of the flight 286B is measured between the extension direction D2 and the negative Y direction.

Figure 30B:
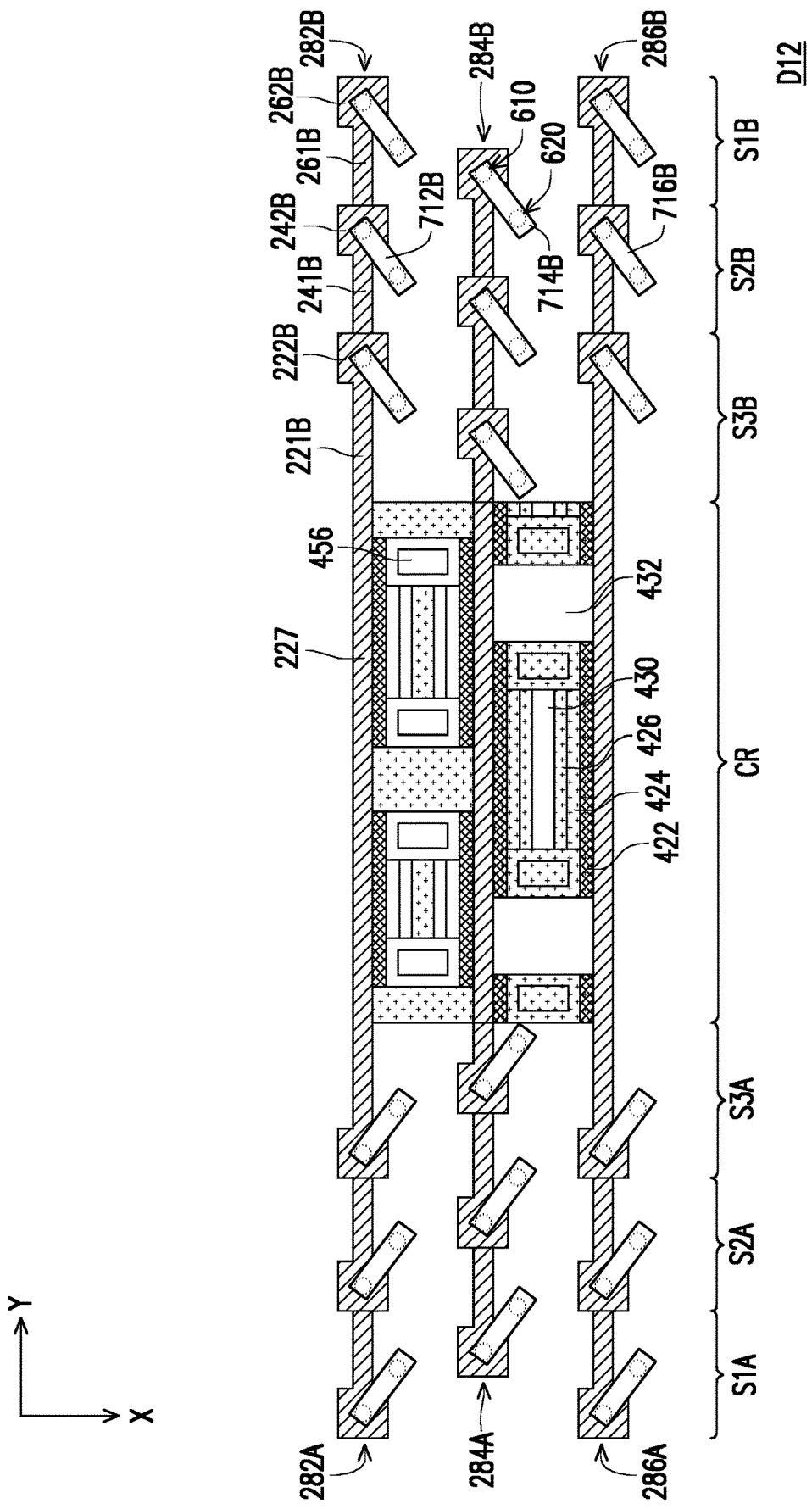

FIG. 30B is a schematic top view of a semiconductor device D12 according to some embodiments of the disclosure. The semiconductor device D12 has a similar structure and is formed following similar processes as previously described for the semiconductor device D10 of FIG. 28. In some embodiments, a difference between the semiconductor device D12 and the semiconductor device D10 lies in the shape of the footprint of the landing pads (e.g., 222, 242, 262) being rectangular, (e.g., square), rather than circular. In some embodiments, the disclosure is not limited by the shape of the footprint of the landing pads (e.g., 222, 242, 262) as long as the landing pads are wider than the adjacent connective lines (e.g., 221, 241, 261). So, for example, in some alternative embodiments, the footprint of the landing pads may have different shapes than circular or rectangular, such as elliptical, polygonal (e.g., pentagonal, hexagonal, heptagonal, octagonal, trapezoid, rhombic, and so on) and so on. Other aspects of the semiconductor devices D10 and D12 may be the same.

Figure 30C:
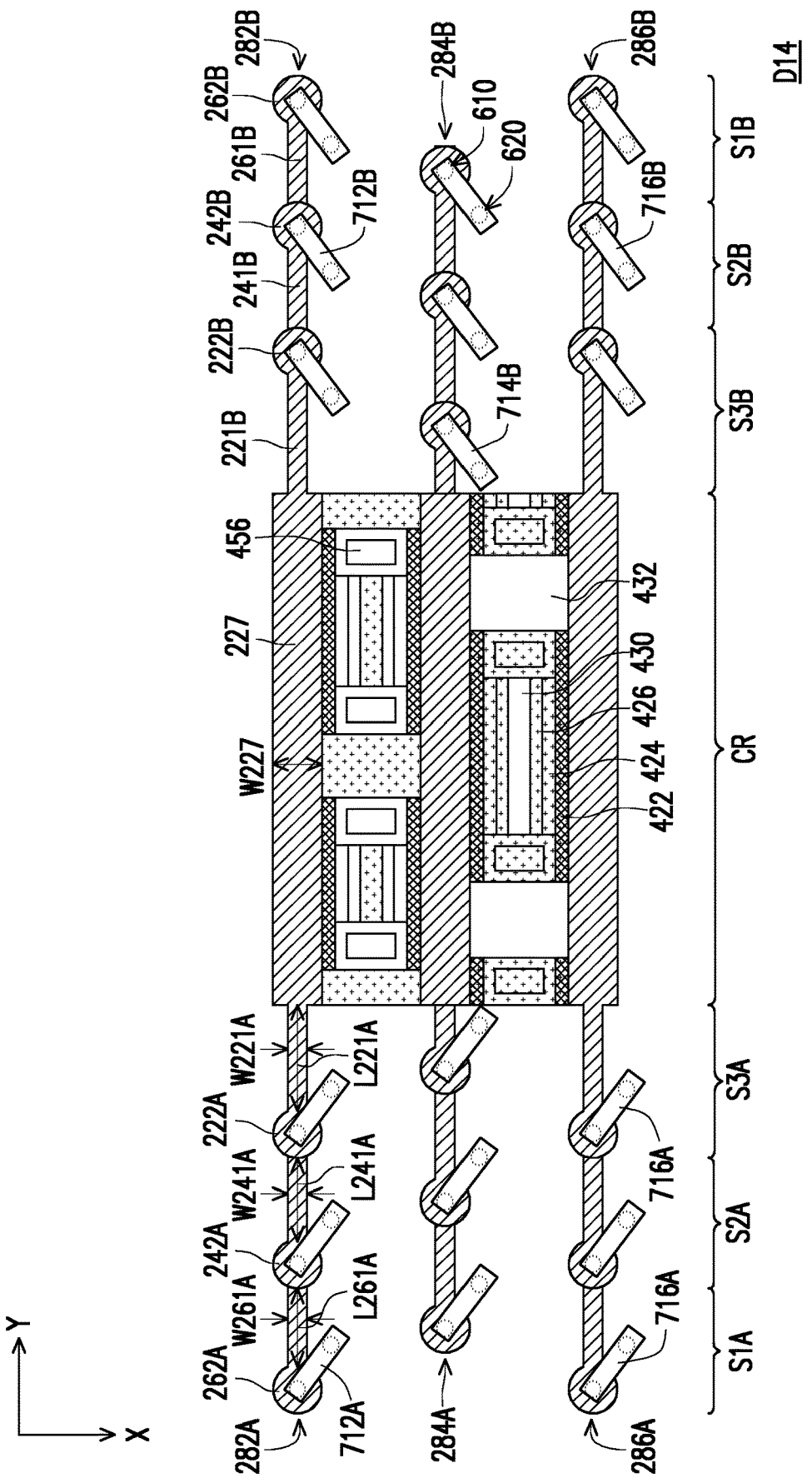

FIG. 30C is a schematic top view of a semiconductor device D14 according to some embodiments of the disclosure. The semiconductor device D14 has a similar structure and is formed following similar processes as previously described for the semiconductor device D10 of FIG. 28. In some embodiments, a difference between the semiconductor device D14 and the semiconductor device D10 lies in that the gate lines (e.g., 227, 247, 267) have a different width (e.g., W227, W247, W267) along the X direction than the associated connective lines (e.g., 221, 241, 261). For example, the ratio of the width (e.g., W221 or W241 or W261) of a connective line (e.g., 221 or 241 or 261) to the width (e.g., W227 or W247 or W267) of the associated gate line (e.g., 227 or 247 or 267) may be in the range from 1 to 1000. For example, the widths of the connective lines (e.g., W221, W241, W261) and the widths of the gate lines (e.g., W227, W247, W267) may independently be in the range from 1 nm to 1000 nm. Other aspects of the semiconductor devices D14 and D10 may be the same.

Figure 30D:
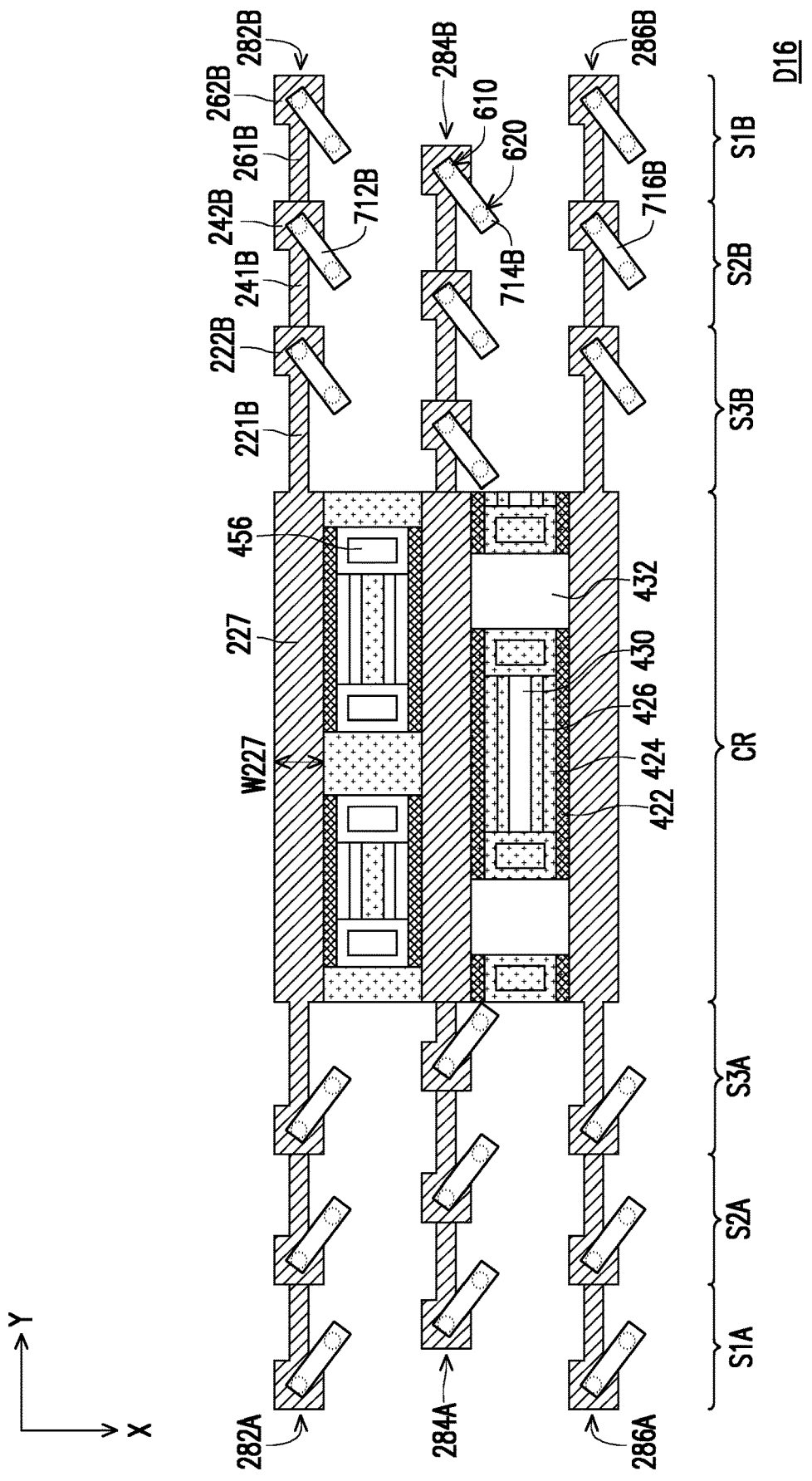

FIG. 30D is a schematic top view of a semiconductor device D16 according to some embodiments of the disclosure. The semiconductor device D16 has a similar structure to the semiconductor device D14 of FIG. 30C and may be formed following similar processes as previously described for the semiconductor device D10 of FIG. 28. In some embodiments, a difference between the semiconductor device D14 and the semiconductor device D16 lies in the shape of the footprint of the landing pads (e.g., 222, 242, 262) being rectangular, (e.g., square), rather than circular. In some embodiments, the disclosure is not limited by the shape of the footprint of the landing pads (e.g., 222, 242, 262) as long as the landing pads are wider than the adjacent connective lines (e.g., 221, 241, 261). So, for example, in some alternative embodiments, the footprint of the landing pads may have different shapes than circular or rectangular, such as elliptical, polygonal (e.g., pentagonal, hexagonal, heptagonal, octagonal, trapezoid, rhombic, and so on) and so on. Other aspects of the semiconductor devices D14 and D16 may be the same.

Figure 30E:
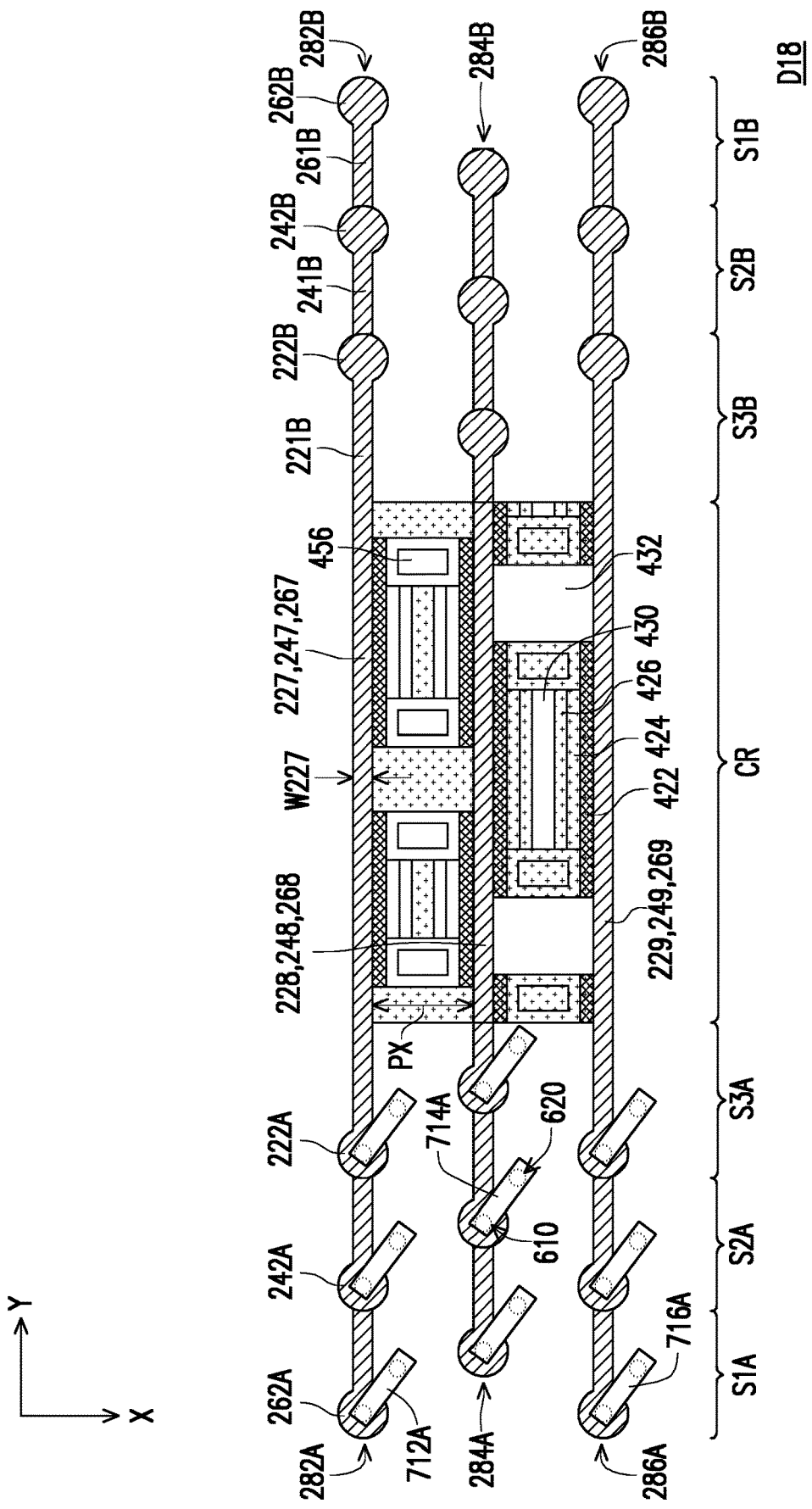

FIG. 30E is a schematic top view of a semiconductor device D18 according to some embodiments of the disclosure. The semiconductor device D18 has a similar structure and is formed following similar processes as previously described for the semiconductor device D10 of FIG. 28. In some embodiments, a difference between the semiconductor device D18 and the semiconductor device D10 lies in that the contact vias 610, 620 and the bridge patterns 712, 714, 716 are formed on a single side of the gate lines 227-229, 247-249, 267-269. For example, the contact vias 610 and 620 are all formed on the sides of the flights 282A, 284A, 286A. Taking as an example the flights 282A and 282B, the contact vias 610 may reach the landing pads 222A, 242A, 262A of the flight 282A, while no contact vias 610 may be formed on the landing pads 222B, 242B, and 262B. Similarly, the contact vias 620 and the bridge patterns 712A are formed only on the side of the flight 282A. In a similar manner, the gate lines 228, 248, 268 are contacted by contact vias 610, 620 and bridge patterns 714 formed only on the side of the flight 284A, and the gate lines 229, 249, 269 are contacted by contact vias 610, 620 and bridge patterns 716 formed only on the side of the flights 286A. In some embodiments, by forming less contact vias 610, 620 and bridge patterns 712, 714, 716, the manufacturing process may be simplified and the manufacturing costs may be reduced. Other aspects of the semiconductor devices D18 and D10 may be the same.

Figure 30F:
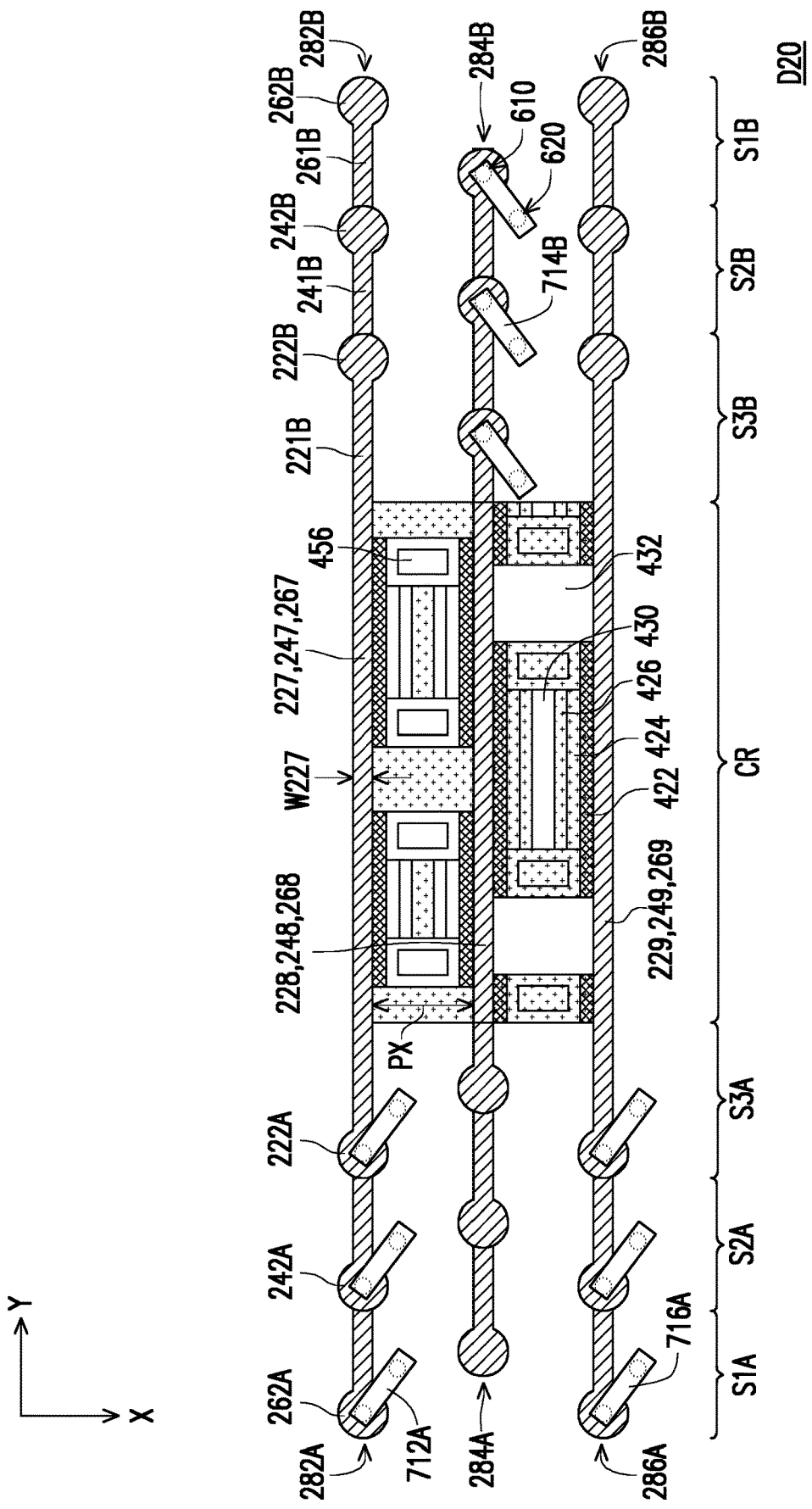

FIG. 30F is a schematic top view of a semiconductor device D20 according to some embodiments of the disclosure. The semiconductor device D20 has a similar structure to the semiconductor device D18 of FIG. 30E and may be formed following similar processes as previously described for the semiconductor device D10 of FIG. 28. In some embodiments, a difference between the semiconductor device D20 and the semiconductor device D18 lies in that the contact vias 610, 620 and the bridge patterns 712, 714, 716 are formed on alternating sides of the gate lines 227-229, 247-249, 267-269. For example, the gate lines 227, 247, 267 are contacted by contact vias 610 formed on the landing pads 222A, 242A, 262A of the flight 282A, while no contact vias 610 may be formed on the landing pads 222B, 242B, 262B of the flight 282. Similarly, for the flights 282 the contact vias 620 and the bridge patterns 712 may be formed only on the side of the flight 282A, while none may be formed on the side of the flight 282B. The gate lines 228, 248, 268 are contacted at an opposite side of the cell region CR with respect to the gate lines 227, 247, 267, and the gate lines 229, 249, 269 are contacted at an opposite side of the cell region CR with respect to the gate lines 228, 248, 268 (e.g., at the same side as the gate lines 227, 247, 267). That is, the contact vias 610, 620 and the bridge patterns 714 contacting the gate lines 228, 248, 268 are formed only on the flight 284B, while the contact vias 610, 620, and the bridge patterns 716 contacting the gate lines 229, 249, 269 are formed only on the flight 286A. In some embodiments, by forming the contact vias 610, 620 and the bridge patterns 712, 714, 716 on alternating sides of the cell region CR, the pitch PX separating the gate lines (e.g., 227 and 228) along the X direction may be further reduced. Other aspects of the semiconductor devices D20 and D18 may be the same.

Figure 30G:
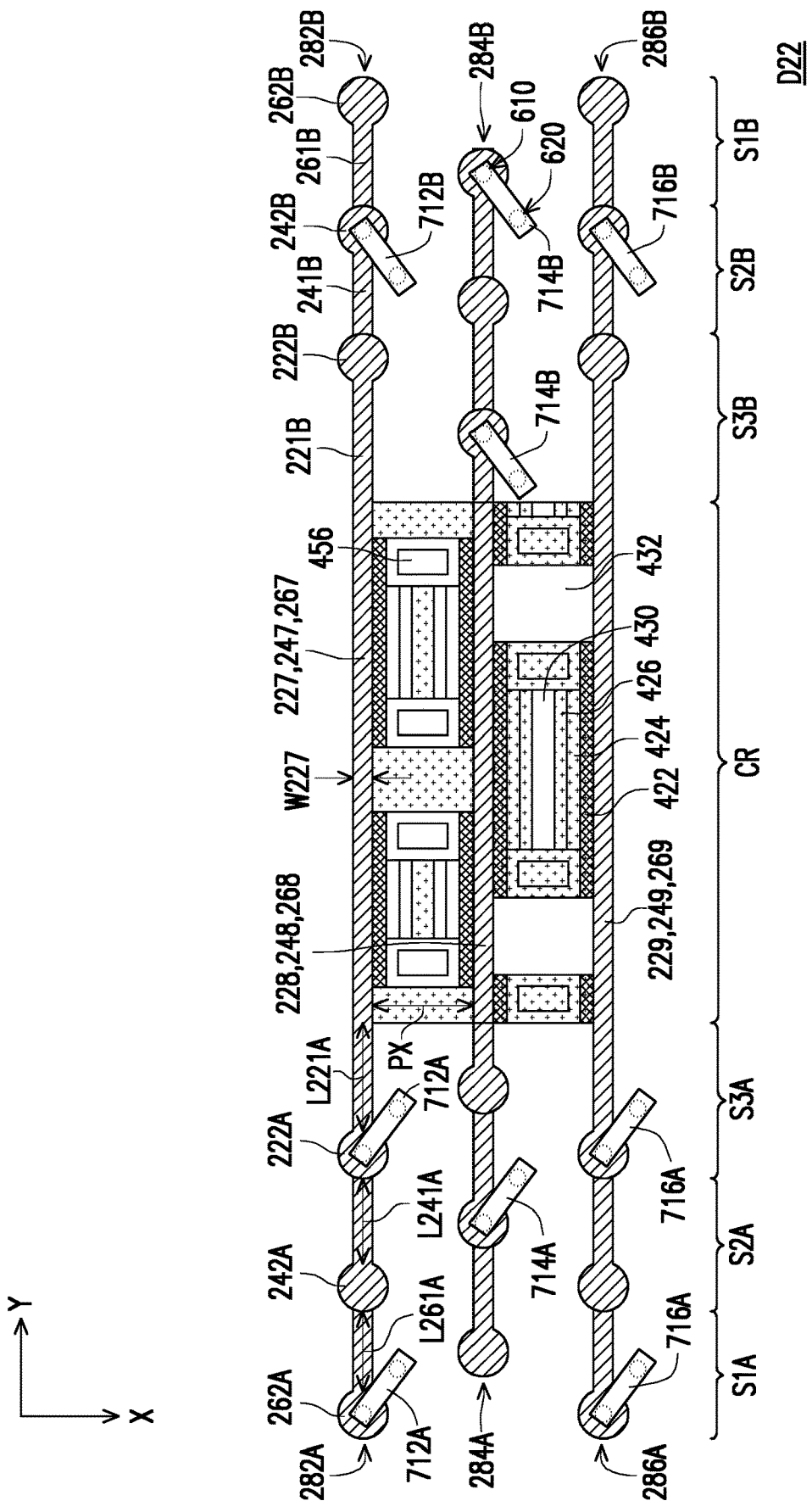

FIG. 30G is a schematic top view of a semiconductor device D22 according to some embodiments of the disclosure. The semiconductor device D22 has a similar structure to the semiconductor device D20 of FIG. 30F and may be formed following similar processes as previously described for the semiconductor device D10 of FIG. 28. In some embodiments, a difference between the semiconductor device D22 and the semiconductor device D20 lies in that for vertically stacked gate lines (e.g., the gate lines 227, 247, 267), the contact vias 610, 620 and the bridge patterns 712, 714, 716 are formed on alternating sides of the cell region CR. So, for example, for the gate lines 227, 247 and 267, the topmost gate line 227 is contacted by contact vias 610, 620 and a bridge pattern 712A formed at the landing pad 222A of the flight 282A, while no contact via 610 is formed on the landing pad 222B of the flight 282B. The next gate line 247 in the stack, is contacted by contact vias 610, 620 and a bridge pattern 712B formed at the landing pad 242B of the flight 282B. Proceeding further along the stack, the gate line 267 is contacted by contact vias 610, 620 and a bridge pattern 712A formed at the landing pad 262A of the flight 282A. That is, the contact vias 610, 620 and the bridge patterns 712 of consecutive steps (e.g., S1 and S2 or S2 and S3) of the flights 282 are formed at opposite sides of the cell region CR. In some embodiments, the sides of the cell region CR on which the contact vias 610, 620 and the bridge patterns 712, 714, 716 are formed for a certain step (e.g., the steps S1) may differ for adjacent stacks of gate lines along the X direction. So for example, for the steps S1, the gate line 267 is contacted on the side of the cell region CR of the flight 282A, while the next gate line along the X direction, the gate line 268, is contacted on the side of the cell region CR of the flight 284B, and the further next gate line 269 is contacted again on the side of the cell region CR of the flight 286A. By doing so, same steps (e.g., the steps S1, S2 or S3) of adjacent stacks of gate lines along the X direction (e.g., the stacked gate lines 227, 247, 267, the stacked gate lines 228, 248, 268, and the stacked gate lines 229, 249, 269), are contacted at opposite sides of the cell region CR. That is, if the stacked gate lines 227, 247, 267 are contacted in correspondence of the steps S1A, S2B, and S3A, the stacked gate lines 228, 248, 268 are contacted in correspondence of the steps SIB, S2A, and S3B, and the stacked gate lines 229, 249, 269 are contacted in correspondence of the steps S1A, S2B, and S3A. In some embodiments, the distance between the contact vias 610, 620 and the bridge patterns 712, 714, 716 may increase, allowing further reduction of the pitch PX along the X direction for adjacent stacks of gate lines (e.g., the gate lines 227, 247, 267 and the gate lines 228, 248, 268). In some embodiments, because the contact vias 610, 620 and the bridge patterns 712, 714, 716 are formed on every other step S1-S3 on a given side of the cell region CR, the length along the Y direction (e.g., the lengths L221, L241, L261) of the connective lines (e.g., the connective lines 221, 241, 261) may also be shortened, thus further reducing the footprint required by the array of memory cells of the semiconductor device D22. Other aspects of the semiconductor devices D22 and D20 may be the same.

In accordance with some embodiments of the disclosure, a tridimensional memory cell array includes first conductive lines, second conductive lines, first flights of steps, and second flights of steps. The first conductive lines are vertically stacked and extend along a first direction. The second conductive lines are vertically stacked, extend along the first direction, and are disposed at a distance along a second direction from the first conductive lines. The second direction is orthogonal to the first direction. The first flights of steps are disposed at opposite ends of the stacked first conductive lines along the first direction. The second flights of steps are disposed at opposite ends of the stacked second conductive lines along the first direction. The first flights of steps and the second flights of steps include landing pads and connective lines alternately disposed along the first direction. The landing pads are wider than the connective lines along the second direction. The landing pads of the first flights of steps face the connective lines of the second flights of steps along the second direction. The landing pads of the second flights of steps face the connective lines of the first flights of steps along the second direction.

In accordance with some embodiments of the disclosure, a semiconductor device includes driving circuitry and tridimensionally arranged memory cells connected to the driving circuitry. The tridimensionally arranged memory cell include first gate lines, first memory cell layers, first source and drain lines, first connective lines, first landing pads, second memory cell layers, second gate lines, second connective lines, and second landing pads. The first gate lines are vertically stacked on each other. The first memory cell layers extend along a stacking direction of the first gate lines and contact the first gate lines. The first source and drain lines extend along the stacking direction of the first gate lines and are separated from the first gate lines along a first direction by at least one layer of the first memory cell layers. The first connective lines are disposed in contact with the first gate lines at opposite sides of the first gate lines along a second direction. The first landing pads are disposed in contact with the first connective lines along the second direction and wider than the first connective lines along the first direction. The second memory cell layers extend along the stacking direction of the first gate lines and are disposed at an opposite side of the first source and drain lines along the first direction with respect to the first memory cell layers. The second gate lines are vertically stacked on each other and disposed at an opposite side of the second memory cell layers with respect to the first gate lines. The second connective lines are disposed in contact with the second gate lines at opposite sides of the second gate lines along the second direction. The second landing pads are disposed in contact with the second connective lines along the second direction and are as wide as the first landing pads along the first direction. The second connective lines are shorter than the first connective lines along the second direction. The first landing pads are disposed at different level heights along the second direction than the second landing pads. The stacking direction, the first direction, and the second direction are orthogonal directions.

In accordance with some embodiments of the disclosure, a manufacturing method of a semiconductor device includes the following steps. Dielectric layers and conductive layers are alternately stacked in a multi-layer stack over a semiconductor substrate. The multi-layer stack is sequentially patterned to form a multi-layered structure having a central region and a pair of staircases formed at opposite sides of the central region along a first direction. The staircases include flights of steps extending along the first direction. Top surfaces of the conductive layers are exposed in correspondence of the steps. The flights of steps comprise connective lines and landing pads alternately disposed along the first direction. The connective lines are narrower than the landing pads along a second direction perpendicular to the first direction. For adjacent flights of steps, the landing pads of a flight of steps are disposed along the second direction in between connective lines of the adjacent flights of steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a stacked structure comprising a plurality of memory cells;
first flights of steps disposed at an end of the stacked structure along a first direction; and
second flights of steps adjacent to the first flights of steps disposed at the end of the stacked structure along the first direction,
wherein the first flights of steps and the second flights of steps comprise first portions and second portions alternately disposed along the first direction,
the second portions are wider than the first portions along a second direction.

2. The memory device of claim 1, wherein the second portions of the first flights of steps are disposed in a staggered configuration with respect to the second portions of the second flights of steps.

3. The memory device of claim 2, wherein
the second portions of the first flights of steps face the first portions of the second flights of steps along the second direction, and
the second portions of the second flights of steps face the first portions of the first flights of steps along the second direction.

4. The memory device of claim 1, wherein the width of the first portions along the second direction is larger than the width of the first portions along the second direction.

5. The memory device of claim 1, wherein the stacked structure comprises an upper conductive line and a lower conductive line, the upper conductive line is stacked on the lower conductive line, and at least one more first portion and second portion are connected at each end of the lower conductive line than a number of connective lines and second portions connected at each end of the upper conductive line.

6. The memory device of claim 1, wherein a length along the first direction of the first portions of the first flights of steps directly connected to the end of the stacked structure is greater than a length along the first direction of the first portions of the second flights of steps directly connected to the end of the stacked structure.

7. A semiconductor device, comprising:
first gate lines vertically stacked on each other;
first connective lines disposed in contact with the first gate lines at opposite sides of the first gate lines along a second direction;
first landing pads disposed in contact with the first connective lines along the second direction and wider than the first connective lines along a first direction;
second gate lines, vertically stacked on each other and disposed adjacent to the first gate lines;
second connective lines disposed in contact with the second gate lines at opposite sides of the second gate lines along the second direction; and
second landing pads disposed in contact with the second connective lines along the second direction and as wide as the first landing pads along the first direction,
wherein the second connective lines are shorter than the first connective lines along the second direction,
the first landing pads are disposed at different level heights along the second direction than the second landing pads, and the first direction, and the second direction are orthogonal directions.

8. The semiconductor device of claim 7, further comprising:
first isolation lines alternately stacked with the first gate lines;
second isolation lines alternately stacked with the second gate lines;
first isolation pads alternately stacked with the first landing pads; and
second isolation pads alternately stacked with the second landing pads.

9. The semiconductor device of claim 8, further comprising:
third isolation lines alternately stacked with the first connective lines; and
fourth isolation lines alternately stacked with the second connective lines.

10. The semiconductor device of claim 7, further comprising:
third connective lines disposed in contact with fewer than all of the first landing pads along the second direction;
third landing pads disposed in contact with the third connective lines along the second direction, wherein the third landing pads are as wide as the first landing pads along the first direction;
fourth connective lines disposed in contact with fewer than all of the second landing pads along the second direction; and
fourth landing pads disposed in contact with the fourth connective lines along the second direction, wherein the fourth landing pads are as wide as the first landing pads along the first direction,
wherein the fourth connective lines are longer than the second connective lines along the second direction.

11. The semiconductor device of claim 10, further comprising:
a first contact via contacting at one end a topmost pad of the first landing pads;
a second contact via contacting at one end a topmost pad of the second landing pads;
a third contact via contacting at one end a topmost pad of the third landing pads; and
a fourth contact via contacting at one end a topmost pad of the fourth landing pads.

12. The semiconductor device of claim 11, wherein the first contact via and the second contact via are formed at opposite sides of the first gate lines and the second gate lines with respect to the second direction.

13. The semiconductor device of claim 11, wherein the third contact via is formed on a same side of the first gate lines as the first contact via, and the fourth contact via is formed at a same side of the second gate lines as the second contact via.

14. The semiconductor device of claim 11, wherein the third contact via is formed on a same side of the first gate lines as the second contact via, and the fourth contact via is formed at a same side of the second gate lines as the first contact via.

15. A method of fabricating a memory device, comprising:
forming a stacked structure comprising a plurality of memory cells;
forming first flights of steps disposed at an end of the stacked structure along a first direction; and
forming second flights of steps adjacent to the first flights of steps disposed at the end of the stacked second conductive lines along the first direction,
wherein the first flights of steps and the second flights of steps comprise first portions and second portions alternately disposed along the first direction,
the second portions are wider than the first portions along a second direction.

16. The method of claim 15, wherein the second portions of the first flights of steps are disposed in a staggered configuration with respect to the second portions of the second flights of steps.

17. The method of claim 16, wherein the second portions of the first flights of steps face the first portions of the second flights of steps along the second direction, and
the second portions of the second flights of steps face the first portions of the first flights of steps along the second direction.

18. The method of claim 15, wherein the width of the first portions along the second direction is larger than the width of the first portions along the second direction.

19. The method of claim 15, wherein the stacked structure comprises an upper conductive line and a lower conductive line, the upper conductive line is stacked on the lower conductive line, and at least one more first portion and second portion are connected at each end of the lower conductive line than a number of connective lines and second portions connected at each end of the upper conductive line.

20. The method of claim 15, wherein a length along the first direction of the first portions of the first flights of steps directly connected to the end of the stacked structure is greater than a length along the first direction of the first portions of the second flights of steps directly connected to the end of the stacked structure.

* * * * *